(12) United States Patent
Mauder et al.

(10) Patent No.: US 8,854,065 B2
(45) Date of Patent: Oct. 7, 2014

(54) CURRENT MEASUREMENT IN A POWER TRANSISTOR

(75) Inventors: Anton Mauder, Kolbermoor (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 453 days.

(21) Appl. No.: 13/350,601

(22) Filed: Jan. 13, 2012

(65) Prior Publication Data

US 2013/0181723 A1 Jul. 18, 2013

(51) Int. Cl.
*G01R 27/08* (2006.01)

(52) U.S. Cl.
USPC .......................................................... 324/691

(58) Field of Classification Search
USPC .......... 324/691–724, 760.02, 762.08, 762.09; 327/538, 543
See application file for complete search history.

(56) References Cited

U.S. PATENT DOCUMENTS

| | | | |
|---|---|---|---|
| 5,635,823 A * | 6/1997 | Murakami et al. | 323/277 |
| 5,877,617 A * | 3/1999 | Ueda | 323/316 |
| 6,479,975 B1 * | 11/2002 | Plankensteiner et al. | 323/316 |
| 6,573,558 B2 | 6/2003 | Disney | |
| 6,737,856 B2 * | 5/2004 | Sander | 324/762.09 |
| 2006/0250153 A1 * | 11/2006 | Colbeck | 324/769 |
| 2007/0205778 A1 * | 9/2007 | Fabbro et al. | 324/713 |
| 2008/0164497 A1 * | 7/2008 | von Borcke | 257/252 |
| 2011/0037126 A1 | 2/2011 | Kadow et al. | |
| 2011/0221421 A1 * | 9/2011 | Williams | 324/76.11 |
| 2012/0049273 A1 | 3/2012 | Hirler et al. | |

* cited by examiner

*Primary Examiner* — Patrick Assouad
*Assistant Examiner* — Demetrius Pretlow
(74) *Attorney, Agent, or Firm* — Slater & Matsil, L.L.P.

(57) ABSTRACT

A circuit arrangement includes a load transistor and a sense transistor. The first load terminal of the load transistor is coupled to the first load terminal of the sense transistor. A measurement circuit comprising a current source configured to provide a calibration current, the measurement circuit configured to measure a first voltage between the first load terminal and the second load terminal of the sense transistor in the on-state of the sense transistor, to determine a resistance of the sense transistor based on the calibration current and the first voltage, to measure a second voltage between the first load terminal and the second load terminal of the load transistor in the on-state of the load transistor, and to determine a load current through the load transistor based on the resistance of the sense transistor and the second voltage.

29 Claims, 10 Drawing Sheets

US 8,854,065 B2

CURRENT MEASUREMENT IN A POWER TRANSISTOR

TECHNICAL FIELD

Embodiments of the present invention relate to a circuit arrangement with a power transistor and a current measurement circuit and to a method for measuring the current in a power transistor.

BACKGROUND

Power transistors are widely used for switching electrical currents in automotive or industrial applications. For example, power transistors can be employed in any kind of switched-mode power supply, in drive circuits for driving loads, such as lamps, inductive valves, or motors, in inverters, or the like. In order to regulate the current through the load or in order to simply detect an overload scenario it is desired in many applications to measure the current flowing through the transistors.

Different concepts are known for measuring a load current through a transistor. These concepts include, e.g., connecting a shunt resistor in series with the load path of the transistor and measuring the voltage across the resistor, measuring the current using a Hall sensor, or inductively measuring the current using an inductive current sensor.

Power transistors usually include a plurality of identical transistor cells connected in parallel. According to a further concept, at least one of these transistor cells (sense cell) is used to measure the current through the other transistors cells (load cells) of the transistor. The sense cell is operated in the same operation point as the load cells (but only the current through the sense cells is measured), so that the current through the sense cell is proportional to the overall load current through the load cells. The proportionality factor is given by the ratio between the number of sense cells and the number of load cells.

There is a further need to accurately measure the current through a power transistor with low measuring losses.

SUMMARY OF THE INVENTION

A first embodiment relates to a circuit arrangement including a load transistor. The load transistor and the sense transistor each include a control terminal, a first load terminal and a second load terminal. The control terminal of the load transistor is coupled to the control terminal of the sense transistor. The first load terminal of the load transistor is coupled to the first load terminal of the sense transistor. The load transistor and the sense transistor are configured to be operated in an on-state or in an off-state. The circuit arrangement further includes a measurement circuit including a current source configured to provide a calibration current. The measurement circuit is configured to measure a first voltage between the first load terminal and the second load terminal of the sense transistor in the on-state of the sense transistor. The measurement circuit is configured to determine a resistance of the sense transistor based on the calibration current and the first voltage. The measurement circuit is configured to measure a second voltage between the first load terminal and the second load terminal of the load transistor in the on-state of the load transistor, and to determine a load current through the load transistor based on the resistance of the sense transistor and the second voltage.

A second embodiment relates to a method for measuring the current through a load transistor having a control terminal, a first load terminal and a second load terminal. The method includes providing a sense transistor including a control terminal, a first load terminal and a second load terminal, and coupling the control terminal of the sense transistor to the control terminal of the load transistor and the first load terminal of the sense transistor to the first load terminal of the load transistor. The method further includes operating the sense transistor in an on-state, driving a calibration current through the sense transistor and measuring a first voltage between the first load terminal and the second load terminal of the sense transistor. A resistance of the sense transistor is determined based on the calibration current and the first voltage. A second voltage between the first load terminal and the second load terminal of the load transistor is measured in the on-state of the load transistor. A load current through the load transistor is determined based on the resistance of the sense transistor and the second voltage.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
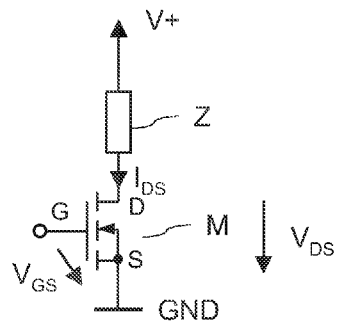
FIG. 1 schematically illustrates the use of a power transistor for switching a current through a load.

FIG. 1 schematically illustrates the use of a power transistor as an electronic switch for switching a load current $I_{DS}$ through a load Z. The load Z can be any kind of electric load, such as an inductive load, a resistive load, a capacitive load, or a combination thereof. The load Z may include a complex electronic circuit with a plurality of electronic devices and may include further power transistors. The power transistor M illustrated in FIG. 1 is implemented as a MOSFET, specifically as an n-type MOSFET. However, this is only for illustration purposes. Power transistors used as electronic switches are not restricted to be n-type MOSFETs. Instead, other types of MOSFETs, such as p-type MOSFETs, IGBTs (Insulated Gate Bipolar Transistors), power JFETs (Junction Field-Effect Transistors), or power BJTs (Bipolar Junction Transistors) can be used as well.

In the embodiment illustrated in FIG. 1, the power transistor M is connected as low-side switch, which means the power transistor M is connected between the load Z and a terminal for a low-side potential or reference potential, such as ground GND. However, this is only an example. The power transistor M could also be connected as a high-side switch. In this case, the power transistor M would be connected between the load Z and a terminal for a high-side potential or positive supply potential V+.

The power transistor M has a control terminal, a first load terminal, a second load terminal, and has a load path between the first load terminal and the second load terminal. In a power MOSFET M, as illustrated in FIG. 1, a gate terminal G is the control terminal, a drain terminal D is the first load terminal, a source terminal S is the second load terminal, and a drain-source path D-S is the load path.

In order to switch the load current $I_{DS}$ through the load Z, the load path D-S of the power transistor M is connected in series with the load Z between the terminals for the high-side supply potential V+ and the low-side supply potential GND. The power transistor M can be switched on and off by applying a suitable drive voltage $V_{GS}$ between the control terminal G and the second load terminal S. In a MOSFET as illustrated in FIG. 1, the drive voltage is the gate-source voltage $V_{GS}$ of the MOSFET.

Figure 2:
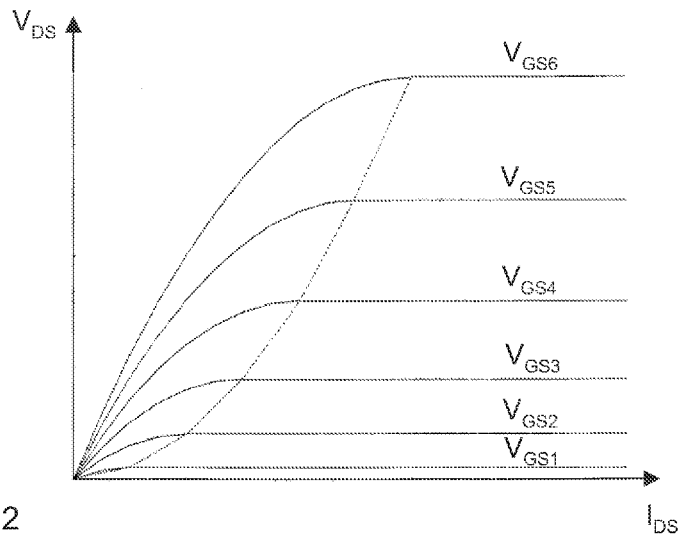
FIG. 2 illustrates characteristic curves of a MOSFET.

FIG. 2 shows typical characteristic curves of a n-type (enhancement) power MOSFET. FIG. 2 shows the load current or drain-source current $I_{DS}$ dependent on the load voltage (drain-source voltage) $V_{DS}$ at different control voltages (gate-source voltages) $V_{GS1}$–$V_{GS6}$ (with $V_{GS1} < V_{GS2} < V_{GS3} < V_{GS4} < V_{GS5} < V_{GS6}$). Referring to FIG. 2, the characteristic curves each have a linear region, which is a region in which the load current $I_{DS}$ increases (approximately) linearly when the load voltage $V_{DS}$ increases, and each have a saturation region, which is a region in which a further increase of the load voltage $V_{DS}$ does not result in a further (significant) increase of the load current $I_{DS}$. The characteristic curves obtained at different control voltages $V_{GS1}$–$V_{GS2}$ are similar and are different with regard to the maximum current, which is the current when the power MOSFET is operated in the saturation region.

A power MOSFET that is operated in the linear region can be considered as an ideal switch connected in series with an ohmic resistance. Typically, power MOSFETs acting as electronic switches when switched on are operated in the linear region. In this case, the maximum load voltage $V_{DS}$ is in the range of several volts, such as between 0V and 3V. The load voltage $V_{DS}$ is dependent on the load current $I_{DS}$ and on the on-resistance ($R_{ON}$) of the MOSFET. The on-resistance is dependent on the voltage blocking capability of the transistor, so that transistors with a high voltage blocking capability usually have a higher specific on-resistance than transistors with a low voltage blocking capability. The "specific on-resistance" ($R_{ON} \cdot A$) of a MOSFET is the product of the on-resistance ($R_{ON}$) and the semiconductor area (A) of the MOSFET The voltage blocking capability of the transistor is usually designed dependent on the application. In industrial applications power transistors having a voltage blocking capability between 50V or 100V and 1000V are typically employed.

In many applications in which power transistors are used as electronic switches it is desired to measure the load current $I_{DS}$ through the load Z and through the power transistor M. The information about the load current can be used in many different ways dependent on the specific application. For example, in current regulators the information about the load current is used to control the load current, in current-mode voltage regulators the information on the load current is used to control an output voltage of the voltage regulator. In other applications, the information about the load current is simply used to detect an overload condition in the load Z.

Figure 3:
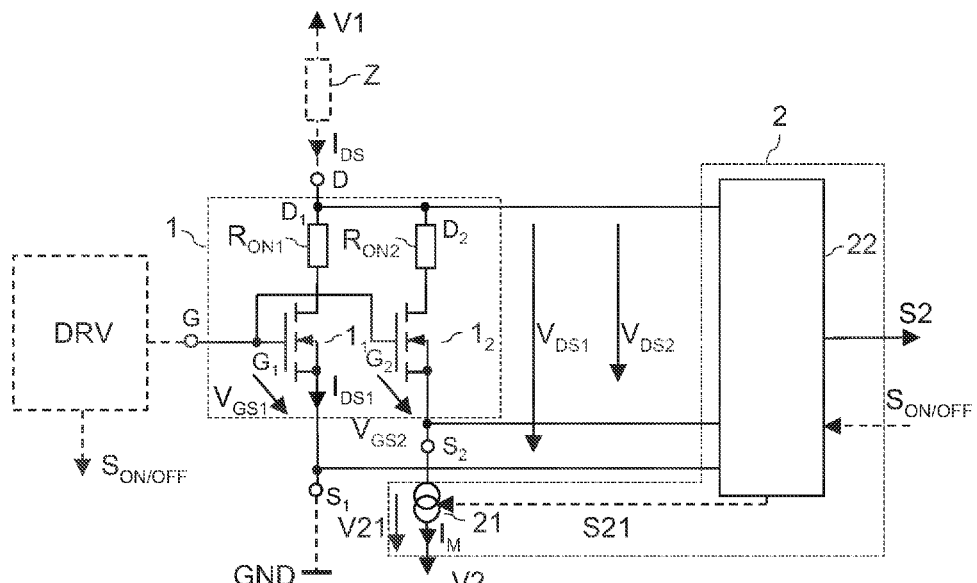
FIG. 3 illustrates a first embodiment of a circuit arrangement with a load transistor, a sense transistor and a measurement circuit.

FIG. 3 illustrates a first embodiment of a circuit arrangement including a load transistor $1_1$ as an electronic switch and configured to measure a load current $I_{DS}$ through the load transistor $1_1$. The load transistor $1_1$ has a control terminal $G_1$, a first load terminal $D_1$, and a second load terminal $S_1$. Like in the circuit explained with reference to FIG. 1, the load transistor $1_1$ of FIG. 3 is implemented as a MOSFET, specifically as an n-type MOSFET. However, this is only an example. The load transistor $1_1$ is not restricted to be implemented as a MOSFET. Instead, another type of MOSFET, such as a p-type MOSFET, or another type of power transistor, such as a power JFET, or power BJT may be used as well. In the embodiment of FIG. 3, the control terminal of the load transistor $1_1$ is the gate terminal $G_1$ of the MOSFET, the first load terminal $D_1$ is the drain terminal of the MOSFET, and the second load terminal $S_1$ is the source terminal of the MOSFET.

The circuit arrangement further includes a sense transistor $1_2$ having a control terminal $G_2$, a first load terminal $D_2$, and a second load terminal $S_2$. The sense transistor $1_2$ is of the same type as the load transistor $1_1$, so that in the embodiment illustrated in FIG. 3, the sense transistor $1_2$ is implemented as a MOSFET, specifically as an n-type MOSFET. The control terminal $G_2$ of the sense transistor $1_2$ is coupled to the control terminal $G_1$ of the load transistor $1_1$, and the first load terminal $D_2$ of the sense transistor $1_2$ is coupled to the first load terminal $D_1$ of the load transistor $1_1$. A terminal to which the control terminals $G_1$, $G_2$ of the load transistor $1_1$ and the sense transistor $1_2$ are connected to will be referred to as common control terminal G in the following, and a terminal to which the first load terminals $G_1$, $G_2$ of the load transistor $1_1$ and the sense transistor $1_2$ are connected to will be referred to as common first load terminal D in the following.

The load transistor $1_1$ and the sense transistor $1_2$ are part of a transistor arrangement 1. According to one embodiment, the transistor arrangement 1 is integrated in a common semiconductor body. Embodiments for implementing the load transistor $1_1$ and the sense transistor $1_2$ in a common semiconductor body are explained with reference to drawings herein below.

In the circuit arrangement of FIG. 3, the load transistor $1_1$ and the sense transistor $1_2$ can be implemented as common gate and common drain transistors, while the source terminals $S_1$, $S_2$ are separate terminals. The separate source terminal $S_2$ of the sense transistor $1_2$ can be used for current measurement purposes as will be explained below. According to a further embodiment (not shown) the load transistor $1_1$ and the sense transistor $1_2$ are implemented as common gate and common source transistors. In this embodiment, the first load terminals that are connected to a common load terminal are the source terminals of the load transistor $1_1$ and the sense transistor $1_2$, respectively, while the second load terminals are the drain terminals. These drain terminals are separate and are used for current measurement purposes.

Referring to the explanation provided with reference to FIG. 2, a power transistor, in particular a power MOSFET, operated in the linear region can be considered as an ideal switch having an ohmic resistor connected in series. For explanation purposes, resistors representing the on-resistances $R_{ON1}$, $R_{ON2}$ of the load transistor $1_1$ and the sense transistor $1_2$, respectively, are also shown in FIG. 3. When the load transistor $1_1$ and the sense transistor $1_2$ are operated in the linear region, the on-resistances are independent of the currents flowing through the individual transistors $1_1$, $1_2$ and are independent of the drain-source voltages $V_{DS1}$, $V_{DS2}$ of the individual transistors $1_1$, $1_2$.

Referring to FIG. 3, the circuit arrangement further includes a current measurement circuit 2. The current measurement circuit 2 is configured to provide a current measurement signal S2 that represents a load current $I_{DS1}$ through the load transistor $1_1$. The current measurement circuit 2 includes a current source 21 connected to the second load terminal $S_2$ of the sense transistor $1_2$ and configured to provide a calibration current $I_M$. The current source 21 is connected between the second load terminal $S_2$ and a terminal for a supply potential V2. The current source may consist of an active circuit delivering a stabilized current. Optionally, the current source may consist of a resistor connected between the supply potential V2 and the second load terminal $S_2$. This supply potential V2 may correspond to the electrical potential at the second load terminal $S_1$ of the load transistor $1_1$ or may be different from the electrical potential at the second load terminal $S_1$ of the load transistor. The electrical potential at the second load terminal $S_1$ of the load transistor $1_1$ is a low-side supply potential, such as ground GND, when the load transistor $1_1$ is used as a low-side switch. According to a further embodiment, the supply potential V2 is an electrical potential that is higher than the electrical potential at the second load terminal $S_1$ of the load transistor $1_1$. According to a further embodiment, the supply potential V2 is an electrical potential that is lower than the electrical potential at the second load terminal $S_1$ of the load transistor $1_1$. The current flow direction of the calibration current $I_M$ can be defined by the current source 21. The calibration current $I_M$ flows in a direction as indicated in FIG. 3 when the supply potential V2 corresponds to the potential at the second load terminal $S_1$ of the load transistor $1_1$, e.g., when the supply potential V2 is more negative than the potential at the first load terminal $D_1$ of the load transistor $1_1$, and the calibration current $I_M$ flows in the opposite direction when the supply potential V2 is a positive supply potential higher than the electrical potential at the common first load terminal D.

The current measurement circuit 2 further includes a control and evaluation circuit 22 configured to measure a first load voltage $V_{DS1}$ of the load transistor $1_1$ and to measure a second load voltage $V_{DS2}$ of the sense transistor $1_2$. The first and second load voltages $V_{DS1}$, $V_{DS2}$ are the drain-source voltages of the load transistor $1_1$ and the sense transistor $1_2$, respectively, in the embodiment of FIG. 3. The control and evaluation circuit 22 can be implemented as a microcontroller or may include a microcontroller. In another embodiment, the control and evaluation circuit 22 can be implemented using at least one amplifier and/or at least one comparator.

The current measurement circuit 2 can be coupled to a drive circuit DRV (illustrated in dashed lines) that generates a gate drive signal received at the common control terminal G. The current measurement circuit 2 can receive information on the gate drive signal by the drive circuit DRV, so as to be capable of detecting whether the load transistor $1_1$ and the sense transistor $1_2$ are driven in an on-state or an off-state. MOSFETs, such as n-type MOSFETs illustrated in FIG. 3, are driven in an on-state, when the absolute value of the gate drive signal (gate-source voltage) is above a threshold value, and are driven in an off-state, when the absolute value of the gate drive signal is below a threshold value. Usually, power transistors acting as electronic switches are supplied with a gate drive signal that is significant higher than a threshold voltage. While the threshold voltage is typically between 0.7V and 8V or between 2V and 5V, the gate drive voltage supplied to power transistors acting as electronic switches is typically between 1.3V and 20V or between 8V and 15V. The current measurement circuit 2 can be configured to measure the on-resistance of the sense transistor $1_2$ at an arbitrary time or during an arbitrary time interval during the on-state of the sense transistor $1_2$. The time when the on-resistance of the sense transistor $1_2$ is measured and the on-resistance of the load transistor $1_1$ is calculated will be referred to as calibration time or calibration period in the following. According to one embodiment, there is a time delay between the time when the load transistor $1_1$ and the sense transistor $1_2$ are switched on and the calibration time. This is to make sure that the on-resistance of the load transistor $1_1$ is determined when the load transistor $1_1$ is in a steady state, so that parasitic effects occurring at the time of switching on the load transistor $1_1$ or shortly after switching on do not negatively influence the measurement result. Such parasitic effects are, e.g., charging or discharging of internal parasitic capacitances (such as gate-source, gate-drain, or drain-source capacitances), or diode recovery processes. Equivalently, there can be a time delay between the calibration time and the time when the load transistor $1_1$ starts to switch off.

According to a further embodiment (illustrated in dashed lines in FIG. 3), the current source 21 is a controlled current source that can be switched on and off through a control signal S21 received by the current measurement circuit 2. In this case, the current source 21 is configured to provide a constant calibration current $I_M$ when the current source 21 is switched on, and does not provide a calibration current (a calibration current of 0) when it is switched off. In this embodiment, the current measurement circuit 2 can be configured to switch on the current source 21 each time the sense transistor $1_2$ and the load transistor $1_1$ are switched on. The information on the switching state of the sense transistor $1_2$ can be provided to the current measurement circuit 2 through a switching state signal $S_{ON/OFF}$ provided by the drive circuit DRV.

Figure 4:
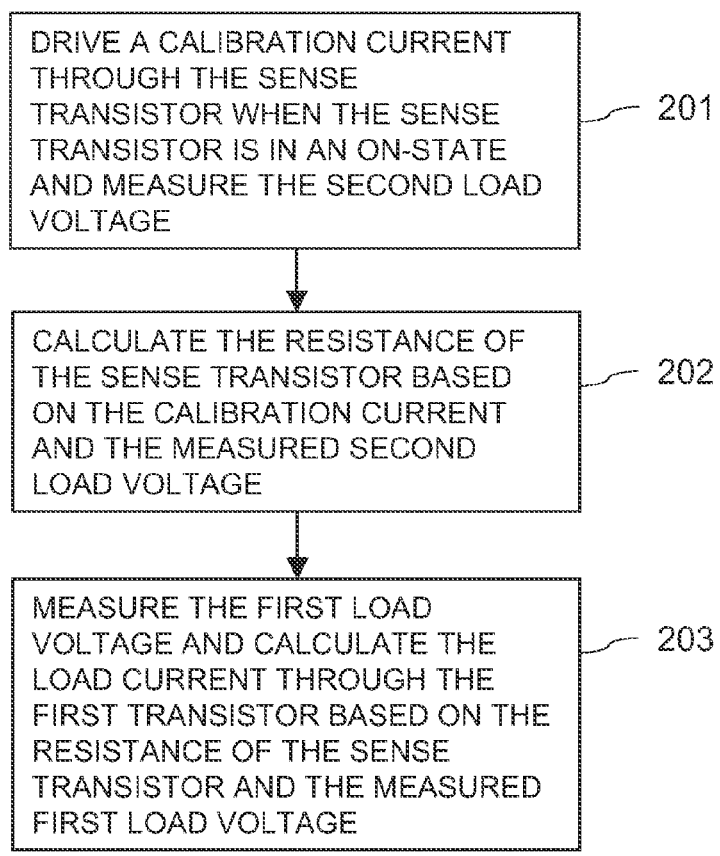
FIG. 4 illustrates method steps for measuring the load current through the load transistor.

The operating principle of the circuit arrangement of FIG. 3 and a method for measuring the load current $I_{DS1}$ using this circuit arrangement, respectively, is explained with reference to FIG. 4 below. FIG. 4 schematically illustrates individual method steps performed by the circuit arrangement of FIG. 3 in order to determine the load current $I_{DS1}$ and to generate the current measurement signal S2.

Referring to FIG. 4, measuring the load current $I_{DS1}$ through the load transistor $1_1$ includes (step 201 in FIG. 4) driving the calibration current $I_M$ through the sense transistor $1_2$ when the sense transistor $1_2$ is in an on-state, and measuring the second load voltage $V_{DS2}$. The current source 21 can be implemented as an uncontrolled constant current source. Of course, the current source 21 can only drive the calibration current $I_M$ through the sense transistor $1_2$ when the sense transistor $1_2$ (and the load transistor i) is in the on-state. In this case, the current source 21 "automatically" drives the calibration current $I_M$ through the sense transistor $1_2$ each time the sense transistor $1_2$ is switched on.

Referring to FIG. 4, measuring the load current $I_{DS1}$ further includes (step 202) calculating the resistance $R_{ON2}$ of the sense transistor $1_2$ based on the calibration current $I_M$ and the measured second load voltage $V_{DS2}$. The on-resistance $R_{ON2}$ can be calculated in accordance with Ohm's law as follows:

$$R_{ON2} = \frac{V_{OS2}}{I_M}, \quad (1)$$

where $R_{ON2}$ is the on-resistance of the sense transistor $1_2$, $V_{DS2}$ is the second load voltage $V_{DS2}$ as measured by the current measurement circuit 2, and $I_M$ is the calibration current. According to one embodiment, the calibration current $I_M$ is a fixed current with a current value stored in the current measurement circuit 2. According to a further embodiment (not shown) the current measurement circuit 2 further measures the calibration current $I_M$ and calculates the on-resistance $R_{ON2}$ of the sense transistor $1_2$ based on the measured calibration current $I_M$.

The second load voltage $V_{DS2}$ is a voltage with a polarity as illustrated in FIG. 3, when the calibration current $I_M$ flows in a direction as indicated in FIG. 3. The second load voltage $V_{DS2}$ has a reverse polarity when the calibration current $I_M$ flows in the opposite direction. Thus, the calibration current $I_M$ can flow in the same direction as a load current $I_{DS1}$, but could also flow in the opposite direction. In the latter case, the calibration current $I_M$ would flow through the sense transistor $1_2$ and would then add to the load current $I_{DS1}$ through the load transistor $1_1$. The calibration current $I_M$, however, is not to be taken into account in the calculation of the load current $I_{DS1}$ through the load transistor $1_1$, as will become obvious from the explanation below.

Referring to FIG. 4, determining the load current $I_{DS1}$ further includes (step 203) measuring the first load voltage $V_{DS1}$ and calculating the load current $I_{DS1}$ based on the resistance $R_{ON2}$ of the sense transistor $1_2$ and based on the measured first load voltage $V_{DS1}$.

The load transistor $1_1$ and the sense transistor $1_2$ are transistors of the same type and can be implemented in a common semiconductor body. The load transistor $1_1$ and the sense transistor $1_2$ each have an active transistor area, which will be explained in further detail below. The on-resistance $R_{ON1}$ of the load transistor $1_1$ is (at least approximately) proportional to the on-resistance $R_{ON2}$ of the sense transistor $1_2$, wherein the proportionality factor between the on-resistance $R_{ON1}$ of the load transistor $1_1$ and the on-resistance $R_{ON2}$ of the sense transistor $1_2$ is given by the ratio between the size of the active area $A_2$ of the sense transistor $1_2$ and the size of the active area $A_1$ of the load transistor $1_1$, i.e.:

$$\frac{R_{ON1}}{R_{ON2}} \approx \frac{A_2}{A_1} \quad (2a)$$

$$R_{ON1} \approx \frac{A_2}{A_1} \cdot R_{ON2}. \quad (2b)$$

According to one embodiment, the load transistor $1_1$ and the sense transistor $1_2$ are implemented with a plurality of identical transistor cells having identical channel widths. For explanation purposes it is assumed that the load transistor $1_1$ is implemented with n-transistor cells and that the sense transistor $1_2$ is implemented with m-transistor cells, with m<<n. m is, for example, between 1 and 50, while n can be up to several 100 up to several 1000 or even up to several 10000. In this case, equations (2a) and (2b) can be replaced by:

$$\frac{R_{ON1}}{R_{ON2}} \approx \frac{m}{n} \quad (3a)$$

$$R_{ON1} \approx \frac{m}{n} \cdot R_{ON2}. \quad (3b)$$

The load current $I_{DS1}$ is calculated based on the on-resistance $R_{ON1}$ of the load transistor $1_1$ and the measured first load voltage $V_{DS1}$ as follows:

$$I_{DS1} = \frac{V_{DS1}}{R_{ON1}}. \quad (4)$$

Thus, having obtained the on-resistance $R_{ON1}$ of the load transistor in a calibration step, calculating the load current $I_{DS1}$ merely requires measuring the load voltage $V_{DS1}$ of the load transistor and calculating the load current using equation (4). This can be done very fast.

In the measurement circuit 2 either the resistance $R_{ON2}$ of the sense transistor $1_2$ or the resistance $R_{ON1}$ of the load transistor $1_1$ is stored.

The on-resistance $R_{ON1}$ of the load transistor $1_1$ cannot be calculated exactly based on equations (2b) or (3b) when the electrical potentials at the source terminals $S_1$, $S_2$ of the load transistor $1_1$ and the sense transistor $1_2$ are not identical. When, for example, the second supply voltage V2 corresponds to the electrical potential at the source terminal $S_1$ of the load transistor $1_1$, the gate-source voltage $V_{GS2}$ of the sense transistor $1_2$ corresponds to the gate-source voltage $V_{GS1}$ of the load transistor $1_1$ minus a voltage drop V21 across the current source 21. Referring to FIG. 2, the slope of the characteristic curves in the linear region of a power MOSFET is also dependent on the gate-source voltage. The reciprocal of the slopes of the characteristic curves defines the on-resistance at the corresponding gate-source voltage ($V_{GS1}$-$V_{GS2}$ in FIG. 2).

Since the sense transistor $1_2$ is operated at a lower gate-source voltage than the load transistor $1_1$ the on-resistance $R_{ON2}$ as calculated for the sense transistor $1_2$ does not exactly represent the on-resistance $R_{ON1}$ of the load transistor $1_1$. However, when the gate-source voltage of the load transistor $1_1$ is significantly higher than the threshold voltage, and when the voltage drop at the current source 21 is significantly lower than the gate-source voltage $V_{GS2}$ of the sense transistor $1_2$, the error is very low and the on-resistance $R_{ON2}$ and $R_{ON1}$ of the sense transistor $1_2$ and the load transistor $1_1$, respectively, can be considered proportional. Further, an error that may result from driving the load transistor $1_1$ and the sense transistor $1_2$ with different drive voltages $V_{GS1}$, $V_{GS2}$ is almost negligible when in the MOSFETs $1_1$, $1_2$ the resistance of the gate channel is very low as compared to the overall on-resistances $R_{ON1}$, $R_{ON2}$. This is the case in high voltage MOSFETs in which the overall on-resistance is mainly determined by the resistance of a drift region. Embodiments of drift regions in MOSFETs are explained below.

Optionally, the measurement circuit 2 includes a control circuit that adjusts the electric potential at the source terminal $S_2$ of the sense transistor $1_2$ to be identical to the electric potential at the source terminal $S_1$ of the load transistor $1_1$. Such control circuit (regulation circuit) may include an adjustable resistor, such as a transistor, connected between the source terminal $S_2$ of the sense transistor $1_2$, and an operational amplifier receiving the source potential of the load transistor $1_1$ and the source potential of the sense transistor $1_2$ and configured to adjust the resistance of the adjustable resistor such that these potentials are identical. Such a control circuit is commonly known, so that no further explanations are required in this regard. However, when applying such a control circuit, the supply potential V2 should be lower than the electrical potential at the source terminal $S_1$ of the load transistor $1_1$.

According to a further embodiment (not illustrated) the gate terminals $G_1$, $G_2$ of the load transistor $1_1$ and the sense transistor $1_2$, respectively, are not (directly) coupled, so that these terminals receive different drive potentials. According to one embodiment, the circuit includes a control circuit that adjusts the gate potential (the electrical potentials at the gate terminals $G_1$, $G_2$) such that independent of differences between the source potentials the gate-source voltages $V_{GS1}$, $V_{GS2}$ of the load transistor $1_1$ and the sense transistor $1_2$ are identical, so that the two transistors $1_1$, $1_2$ are operated in the same operation point. In this embodiment, the gate terminal $G_1$ of the load transistor $1_1$ can be connected to the drive circuit DRV and the control circuit can be coupled between the two gate terminals $G_1$, $G_2$ and can be configured to drive the sense transistor $1_2$ dependent on the gate-source voltage $V_{GS1}$ of the load transistor $1_1$ such that the gate-source voltage $V_{GS2}$ of the sense transistor $1_2$ corresponds to the gate-source voltage $V_{GS1}$ of the load transistor $1_1$.

Referring to FIG. 3, the control and evaluation circuit 22 has an input terminal coupled to the common first load terminal (drain terminal) $D_1$, $D_2$ of the load transistor $1_1$ and the sense transistor $1_2$. The control and evaluation circuit 22 has voltage measurement circuitry coupled between this input terminal, the second load terminal $S_1$ of the load transistor $1_1$, and the second load terminal $S_2$ of the sense transistor $1_2$. The voltage across this measurement circuitry corresponds to the first load voltage $V_{DS1}$ and the second load voltage $V_{DS2}$, respectively. These voltages are voltages with a maximum of several volts when the load transistor $1_1$ and the sense transistor $1_2$ are in the on-state. Thus, these voltages can easily be measured by voltage measurement circuitry implemented with low-voltage electronic devices. However, these voltages can increase to several hundred volts when the load transistor $1_1$ and the sense transistor $1_2$ are in the off-state or during certain overload or error conditions, e.g., when there is a short circuit in the load Z.

Figure 5:
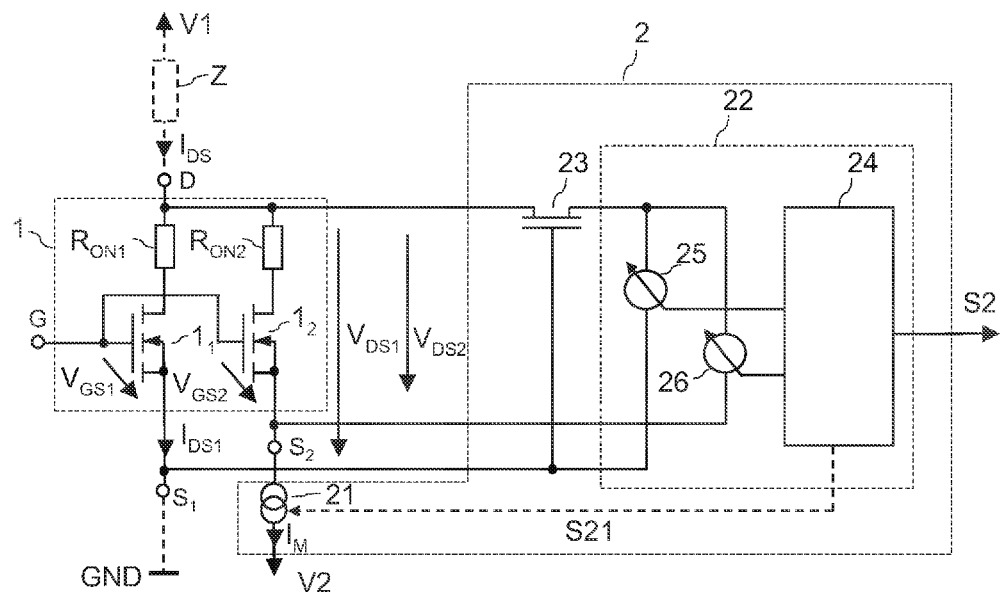
FIG. 5 illustrates one embodiment of the measurement circuit in greater detail.

In order to protect the control and evaluation circuit 22 from high first and second load voltages $V_{DS1}$, $V_{DS2}$, the measurement circuit 22 according to an embodiment illustrated in FIG. 5 includes a voltage limiting or voltage clamping element 23 connected between the common first load terminal D and the input terminal of the control and evaluation circuit 22. Referring to FIG. 5, the voltage clamping element 23 can be implemented as a depletion transistor, such as a depletion MOSFET (as illustrated in FIG. 5), or as a JFET. The load path (drain-source path) of the depletion transistor is connected between the common first load terminal D and the input terminal of the control and evaluation circuit 22, and the control terminal (gate terminal) of the depletion transistor 23 is either connected to the second load terminal $S_1$ of the load transistor $1_1$ or to the second load terminal $S_2$ of the sense transistor $1_2$. The depletion transistor 23 clamps (limits) the voltage received by the measurement circuitry of the control and evaluation circuit 22 to the pinch-off voltage of the depletion transistor 23. The depletion transistor 23 pinches off when the voltage between its gate terminal and the input terminal of the control and evaluation circuit 22 reaches the pinch-off voltage of the depletion transistor 23. The depletion transistor 23 is selected such that its pinch-off voltage is higher than typical load voltages $V_{DS1}$, $V_{DS2}$ occurring when the load transistor $1_1$ and the sense transistor $1_2$, respectively, are in the on-state. Thus, when these transistors are in the on-state, the first and second load voltages $V_{DS1}$, $V_{DS2}$ are passed to the control and evaluation circuit 22 unchanged, while the voltages passed to the control and evaluation circuit 22 are limited to the pinch-off voltage of the depletion transistor 23 when the first load voltage $V_{DS1}$ or the second load voltage $V_{DS2}$, respectively, increases above the pinch-off voltage of the depletion transistor 23.

The measurement circuitry that receives the load voltages $V_{DS1}$, $V_{DS2}$ is only schematically illustrated in FIG. 5. This measurement circuitry includes a first voltage measurement element 25 receiving the first load voltage $V_{DS1}$ and a second voltage measurement element 26 receiving the second load voltage $V_{DS2}$. Voltage measurement signals provided by these voltage measurement elements 25, 26 are received by a calculation unit 24 (only schematically illustrated in FIG. 5) that processes the voltage measurement signals received by the voltage measuring units in a way explained with reference to FIG. 4 in order to provide the current measurement signal S2 representing the load current $I_{DS1}$ through the load transistor $1_1$.

The measurement circuitry for measuring the first and second load voltages $V_{DS1}$, $V_{DS2}$ is only schematically illustrated in FIG. 5. Any kind of measuring unit can be used to measure the first and second load voltages $V_{DS1}$, $V_{DS2}$. The calculation unit 24 can be an analog signal processing unit or a digital signal processing unit that receives the voltage measurement signals from the measurement circuitry and processes the voltage measurement signals in the way explained before.

The routine of calculating the on-resistance $R_{ON2}$ of the sense transistor $1_2$ will be referred to as calibration routine in the following. According to one embodiment, the measurement circuit 2 is configured to perform the calibration routine each time the load transistor $1_1$ (and the sense transistor $1_2$) are switched on. According to a further embodiment, the measurement circuit 2 is configured to perform the calibration routine not in every switching cycle of the load transistor $1_1$, but cyclically in regular or irregular time intervals, or dependent on external parameters.

Determining the on-resistance $R_{ON2}$ of the sense transistor $1_2$ in regular or irregular time intervals or dependent on external parameters can be necessary, because the on-resistance $R_{ON2}$ of the sense transistor $1_2$ and, therefore, the on-resistance of the load transistor $1_1$ may be subject to changes that can be due to changes of the temperature in the transistor arrangement 1 with the load transistor $1_1$ and the sense transistor $1_2$. According to one embodiment, the external parameter is a temperature in the load transistor, the temperature is measured and the calibration routine is performed each time the temperature changes more than a given threshold value, such as 5K, 10K, 20K.

The transistor arrangement 1 with the load transistor $1_1$ and the sense transistor $1_2$ can be implemented in many different ways. Some examples for implementing the transistor arrangement 1 are explained with reference to FIGS. 6 through 18 below.

Figure 6:
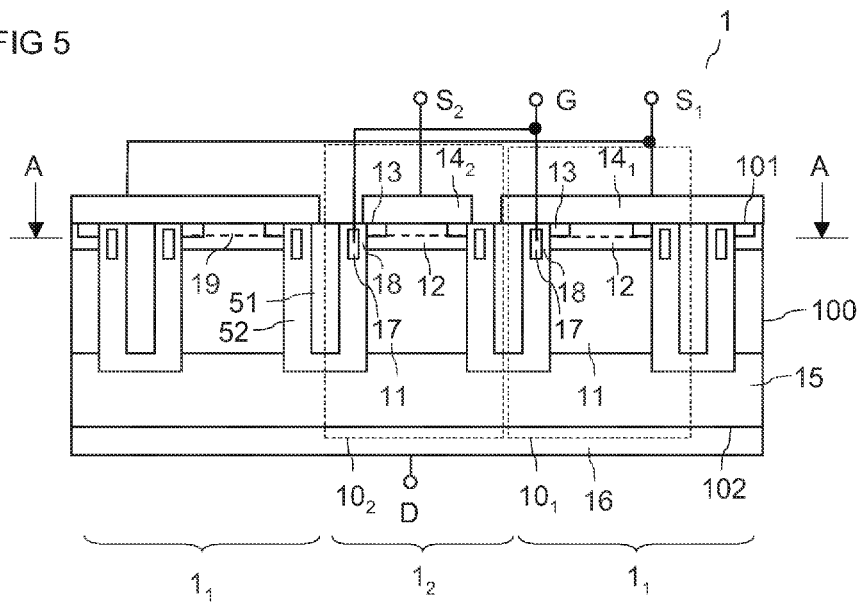
FIG. 6 illustrates a horizontal cross sectional view of a semiconductor body in which a load transistor and a sense transistor according to a first embodiment are implemented.

FIG. 6 illustrates a vertical cross sectional view of a section of a semiconductor body 100 according to a first embodiment in which active device regions of a load transistor $1_1$ and the sense transistor $1_2$ are implemented. The semiconductor body 100 has a first surface 101 and an opposite second surface 102. FIG. 6 illustrates a vertical cross section in a vertical section plane extending perpendicular to the first and second surfaces 101, 102.

In the transistor arrangement of FIG. 6 the load transistor $1_1$ and the sense transistor $1_2$ are each implemented as vertical transistors, which means that a current flow direction of these transistors $1_1$, $1_2$ mainly corresponds to a vertical direction of the semiconductor body 100.

The load transistor $1_1$ includes a plurality of transistor cells connected in parallel. One of these transistor cells is labeled with reference character $10_1$ in FIG. 6. Each of these transistor cells includes a drift region 11, a body region 12 adjoining the drift region 11, a source region 13 separated from the drift region 11 by the body region 12, and a drain region 15 adjoining the drift region 11. A gate electrode 17 is adjacent the body region 12 and is dielectrically insulated from the body region 12 by a gate dielectric 18. The source region 13 and the body region 12 are electrically connected to a source electrode $14_1$. The source electrode $14_1$ forms or is connected to the second load terminal $S_1$ (source terminal) of the load transistor $1_1$. Optionally, a contact region 19 that is higher doped than the body region 12 and has the same doping type as the body region 12 is arranged between the body region 12 and the source electrode $14_1$. A drain electrode 16 is connected to the drain region 15. The drain electrode 16 forms or is connected to the common first load terminal D (drain terminal).

The at least one transistor cell $10_2$ of the sense transistor $1_2$ is identical with the transistor cells $10_1$ of the load transistor $1_1$. Thus, the same features of the transistor cell $10_2$ of the sense transistor $1_2$ have the same reference characters as the corresponding features of the transistor cell $10_1$ of the load transistor $1_1$. The source region 13 and the body region 12 of the at least one transistor cell $10_2$ of the sense transistor $1_2$ are connected to a second source electrode $14_2$ that forms or is connected to the second load terminal $S_2$ of the sense transistor $1_2$.

While the load transistor $1_1$ and the sense transistor $1_2$ have separate source electrodes $14_1$, $14_2$, the drain region 15 and the drain electrode 16 is common to the individual transistor cells $10_1$ of the load transistor $1_1$ and to the at least one transistor cell $10_2$ of the sense transistor $1_2$. The load transistor $1_1$ and the sense transistor $1_2$ can, therefore, be referred to as common drain transistors. The gate electrodes 17 of the individual transistor cells $10_1$, $10_2$ are connected to a common gate terminal G. This is only schematically illustrated for two of the transistor cells shown in FIG. 6.

According to one embodiment, the individual transistor cells $10_1$, $10_2$ of the load transistor and the sense transistor, respectively, are implemented to have identical or at least almost identical channel widths. In this case, the on-resistance $R_{ON1}$ of the load transistor $1_1$ can be easily calculated from the measured on-resistance $R_{ON2}$ of the sense transistor $1_2$ using equation (2b).

Referring to the explanation before, the load transistor $1_1$ and the sense transistor $1_2$ could also be implemented as common source transistors. In this case (not illustrated), the load transistor $1_1$ and the sense transistor $1_2$ have a common source electrode but have separate drain regions and separate drain electrodes. Common source transistors are known, so that no further explanations are required in this regard.

Referring to FIG. 6, the individual transistor cells $10_1$, $10_2$ each further include a field electrode 51 dielectrically insulated from the drift region 11 by a field electrode dielectric 52. The field electrode structure with the field electrode 51 and the field electrode dielectric 52 extends through the drift region 11 to or into the drain region 15. The field electrodes 51 of the transistor cells $10_1$ of the load transistor $1_1$ are electrically connected to the first source electrode $14_1$. Alternatively, these field electrodes 51 are electrically connected to the gate terminal G. In the embodiment illustrated in FIG. 6, one transistor cell $10_2$ of the sense transistor $1_2$ and an adjacent transistor cell of the load transistor $1_1$ have the field electrode 51 in common, so that the field electrode 51 of the sense transistor cell $10_2$ is also connected to the first source electrode $14_1$ in this embodiment. However, this common field electrode 51 could also be connected to the second source electrode $14_2$.

Although the gate electrodes 17 of the load transistor cells $10_1$ and the sense transistor cells $10_2$ are connected to a common gate terminal G in the embodiment illustrated in FIG. 6, it is also possible to connect the gate electrodes of the load transistor cells $10_1$ to a first gate terminal and to connect the gate electrode 17 of the at least one sense transistor cells $10_2$ to a second gate terminal different from the first gate terminal. This allows to adjust the gate drive potentials of the load transistor $1_1$ and the sense transistor $1_2$ independently, as explained herein above.

In the embodiment illustrated in FIG. 6, two gate electrodes 17 or two sections of the gate electrode and one field electrode 51 are arranged in a common trench of the semiconductor body 100, with the gate electrodes 18 being located above the field electrode dielectric 52 and between a section of the field electrode 51 and the body region 12.

In a conventional manner, the field electrode 51 and the gate electrode 17 may include a polycrystalline highly doped semiconductor material, such as polysilicon, and the gate dielectric 18 and the field electrode dielectric 52 may include a semiconductor oxide, such as silicon oxide, or any other type of field electrode dielectric.

In the embodiment illustrated in FIG. 6, the sense transistor $1_2$ has the drift regions 11 of the sense transistor cells $10_2$ separated from drift regions 11 of adjacent load transistor cells $10_1$ by field electrode structures 51, 52. Thus, the calibration current driven into the sense transistor $1_2$ only flows through the drift region 11 of the sense transistor $1_2$, wherein the drift region mainly defines the on-resistance of the sense transistor. Thus, there is no cross current between the drift regions of the sense transistor $1_2$ and the load transistor $1_1$ that may negatively influence the calibration process.

The source region 13, the body region 12, the drift region 11 and the drain region 15 of the individual transistor cells $10_1$, $10_2$ can be implemented with conventional doping concentrations of power transistors. The doping concentration of the source region and the drain region 13, 15 is, for example, in the range of between 5E17 cm-3 and 1E21 cm-3. The doping concentration of the body region 12 is, for example, in the range of between 5E16 cm-3 and 5E18 cm-3. The doping concentration of the drift region 11 is, for example, in the range of between 1E12 cm-3 and 1E16 cm-3.

The load transistor $1_1$ and the sense transistor $1_2$ can be implemented as n-type transistors or as p-type transistors. In n-type transistors the source region 13 and the drift region 11 are n-doped, while the body region 12 is p-doped. In p-type transistors, the source region 13 and the drift region 11 are p-doped, while the body region 12 is n-doped. Further, the transistors can be implemented as MOSFETs or as IGBTs. In MOSFETs the drain region 15 has the same doping type as the drift region 11, but is more highly doped. In IGBTs, the drain region 15 (which is also referred to as emitter region) has a doping type complementary to the doping type of the drift region 11.

Figure 7:
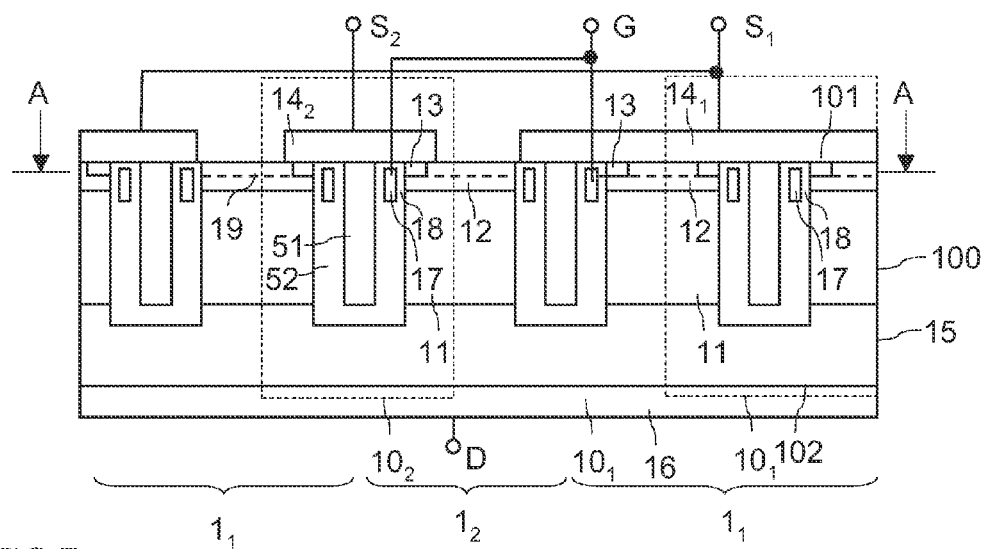
FIG. 7 illustrates a horizontal cross sectional view of a semiconductor body in which a load transistor and a sense transistor according to a second embodiment are implemented.

FIG. 7 illustrates a further embodiment of a transistor arrangement 1 with a load transistor $1_1$ and a sense transistor $1_2$. In the embodiment of FIG. 6, the transistor cell $10_2$ of the sense transistor $1_2$ has a drift region 11 extending between two neighboring trenches, with each trench including a gate electrode 17 of the sense transistor cells $10_2$. In the embodiment of FIG. 7, the drift region 11 of the sense transistor cell $10_2$ extends on opposite sides of one trench in which the gate electrodes 17 of the sense transistor cell are integrated. Further, in the embodiment of FIG. 7 the field electrode 51 of the sense transistor cell $10_2$ is connected to the second source electrode $14_2$.

FIGS. 6 and 7 show vertical cross sectional views of the individual transistor cells $10_1$, $10_2$ of the load transistor $1_1$ and the sense transistor $1_2$, respectively. In a horizontal plane perpendicular to the section planes illustrated in FIGS. 6 and 7, the individual transistor cells $10_1$, $10_2$ can be implemented in different ways.

Figure 8:
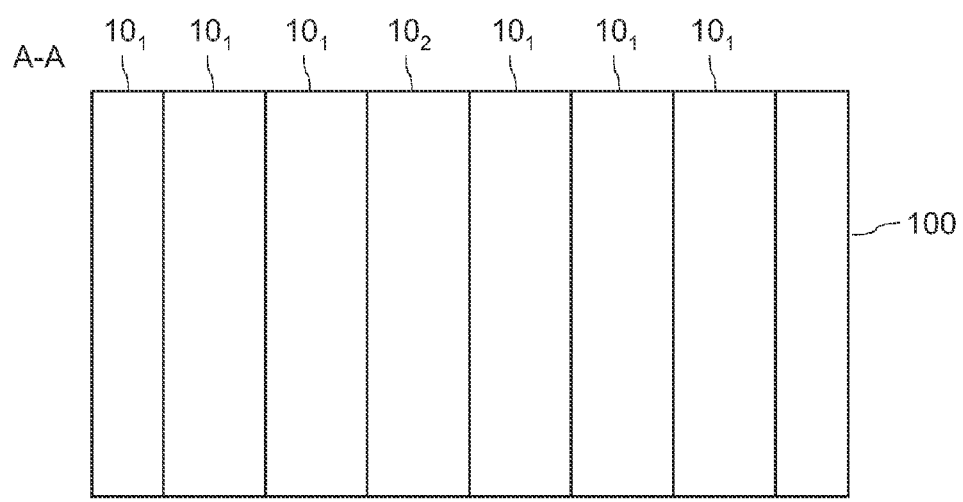
FIG. 8 schematically illustrates a first embodiment for implementing sense transistor cells and load transistor cells in one semiconductor body.

Referring to FIG. 8, the transistor cells $10_1$, $10_2$ can be implemented as elongated transistor cells in the horizontal plane. In FIG. 8, the individual transistor cells $10_1$, $10_2$ are only schematically illustrated. Details of the transistor cells, such as source regions, body regions, gate electrodes and gate dielectrics are not shown.

Figure 9:
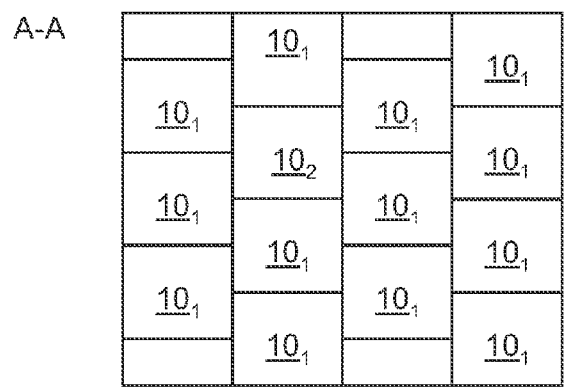
FIG. 9 schematically illustrates a second embodiment for implementing sense transistor cells and load transistor cells in one semiconductor body.

FIG. 9 illustrates a further embodiment for implementing the individual transistor cells $10_1$, $10_2$ in the horizontal plane. In the embodiment of FIG. 9, the individual transistor cells have a rectangular shape. However, this is only an embodiment, the individual transistor cells could also be implemented with a hexagonal shape or with any other polygonal shape in the horizontal plane.

Figure 10:
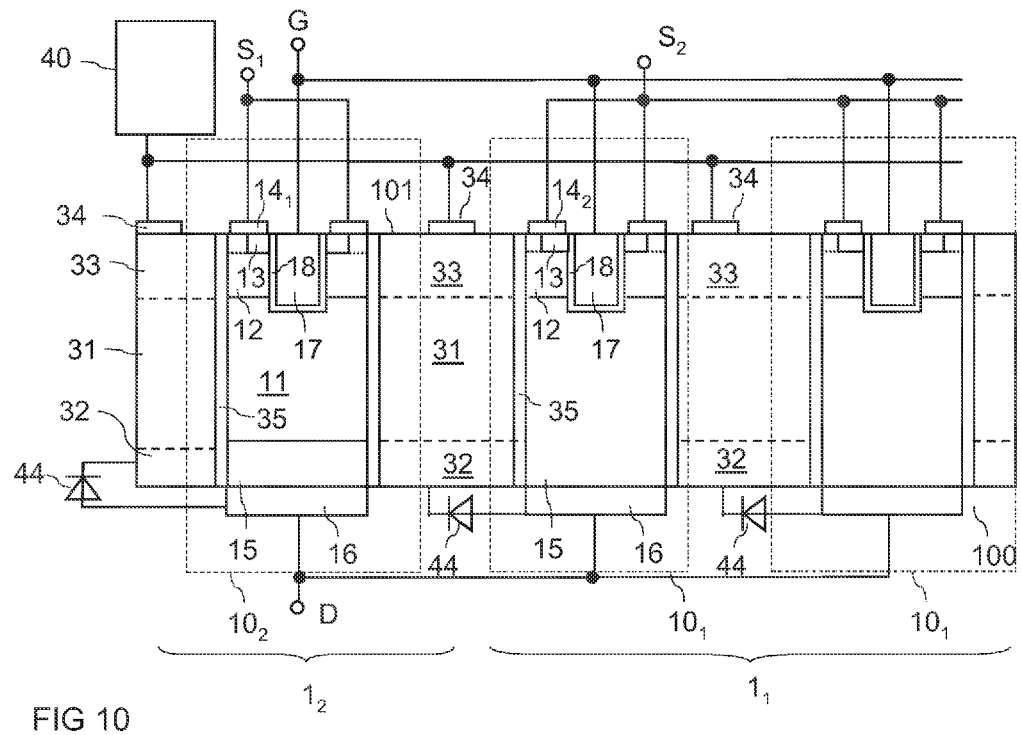
FIG. 10 illustrates a vertical cross sectional view of a semiconductor body in which a load transistor and a sense transistor according to a third embodiment are implemented.

FIG. 10 illustrates a vertical cross sectional view of a section of a semiconductor body 100 in which active device regions of a load transistor $1_1$ and the sense transistor $1_2$ according to a second embodiment are implemented. Like in the embodiments illustrated in FIGS. 6 and 7, the load transistor $1_1$ is implemented with a plurality of transistor cells $10_1$ connected in parallel, and the sense transistor $1_2$ is implemented with at least one transistor cells $10_2$. In FIG. 10, two transistor cells $10_1$ of the load transistor $1_1$ and one transistor cell $10_2$ of the sense transistor $1_2$ are shown.

The load transistor $1_1$ and the sense transistor $1_2$ are both implemented as MOSFETs, specifically as vertical MOSFETs in the present embodiment. Referring to FIG. 10, a vertical MOSFET is a MOSFET in which a current flow direction corresponds to a vertical direction of the semiconductor body 100 in which active device regions of the MOSFET are implemented. The "vertical direction" of the semiconductor body 100 is a direction perpendicular to the first surface 101 of the semiconductor body 100. FIG. 10 shows a vertical cross sectional view of the MOSFET, or, more precisely, a vertical cross sectional view of the semiconductor body 100. The basic operating principle explained in the following, however, is not restricted to vertical MOSFET, but also applies to lateral MOSFET in which a current flow direction corresponds to a lateral direction of a semiconductor body.

Referring to FIG. 10, each of the transistor cells $10_1$, $10_2$ includes a drift region 11, a body region 12, a source region 13, and a drain region 15. The source and drain regions 13, 15 are arranged distant in the current flow direction (the vertical direction of the semiconductor bode 100 in the present embodiment). The body region 12 is arranged between the source region 13 and the drift region 11, and the drift region 11 is arranged between the body region 12 and the drain region 15. The drain region 15 is electrically connected to a drain electrode 16 that forms or that is connected to the common first load terminal (drain terminal D). The source region 13 and the body region 12 of the transistor cells $10_1$ of the load transistor $1_1$ are electrically connected to a first source electrode $14_1$ which forms or which is connected to the second load terminal $S_1$ of the load transistor $1_1$, and the source region 13 and the body region 12 of the at least one transistor cells $10_1$ of the sense transistor $1_2$ is electrically connected to a second source electrode $14_2$ which forms or which is connected to the second load terminal $S_2$ of the sense transistor $1_2$. The body regions 12 of the load transistor cells $10_1$ and/or of the sense transistor cells $10_2$ may be connected to the corresponding second load terminal $S_1$, $S_2$ via higher doped regions of the same doping type as the body regions 12. Those higher doped regions are indicated by the dotted lines in FIG. 10.

The drift region 11, the body region 12, the source region 13, and the drain region 15 form active device regions of the MOSFET and are implemented in the semiconductor body 100. The active device regions are monocrystalline semiconductor regions according to one embodiment. The drain electrode 16 may include, e.g., a highly doped monocrystalline semiconductor substrate, a polycrystalline semiconductor material, a silicide or a metal. The source electrode may include a polycrystalline semiconductor material, a silicide or a metal.

Each of the transistor cells $10_1$, $10_2$ further includes a gate electrode 17 extending from the source region 13 through the body region 12 to or into the drift region 11. The gate electrode 17 is dielectrically insulated from these semiconductor regions by a gate dielectric 18 and is connected to the common gate terminal G. The gate dielectric 18 can be a conventional gate dielectric and includes, for example, an oxide, a nitride, or a high-k dielectric.

The MOSFET can be implemented as an n-type MOSFET or as a p-type MOSFET. In an n-type MOSFET, the source region 13 and the drain region 15 are n-doped, while the body region 12 is p-doped. In a p-type MOSFET, the source region 13 and the drain region 15 are p-doped while the body region 12 is n-doped. The doping concentration of the source region and the drain region 13, 15 is, for example, in the range of between 5E17 cm-3 and 1E21 cm-3. The doping concentration of the body region 12 is, for example, in the range of between 5E16 cm-3 and 5E18 cm-3. The doping concentration of the drift region 11 is, for example, in the range of between 1E12 cm-3 and 1E15 cm-3.

In the type of MOSFETs illustrated in FIG. 10, the drift region 11 can have the same doping type as the source region 13 and the drain region 15, can be doped complementarily to the source region 13 and the drain region 15 or could also have both doping types dominating in sections of the drift region 11 (not illustrated), wherein at least one section of the drift region 11 between a dielectric layer 35 which will be explained in the following and a channel region of the MOSFET may have the same doping type as the source region 13. The "channel region" of the MOSFET is a region of the body region 12 along the gate dielectric 18 where the gate electrode controls a conducting channel.

Referring to FIG. 10, each transistor cell $10_1$, $10_2$ further includes a drift control region 31 that is dielectrically insulated from the drift region 11 by a dielectric layer 35. The dielectric layer 35 will be referred to as drift control region dielectric 35 in the following. The drift control region dielectric 35 extends in the current flow direction. Thus, in the embodiment illustrated in FIG. 10, the drift control region dielectric 35 is a vertical dielectric layer extending in the vertical direction of the semiconductor body 100. The drift control region 31 is configured to generate a conducting channel in the drift region 11 along the drift control region dielectric 35 when the corresponding MOSFET is in an on-state. This conducting channel helps to reduce the on-resistance of the MOSFET. each of the MOSFETs $1_1$, $1_2$, like a conventional MOSFET, is in the on-state, when an electrical potential is applied to the gate terminal G that induces a conducting channel in the body region 12 between the source region 13 and the drift region 11 along the gate dielectric 18, and when an electrical voltage is applied between the drain and the source terminals D, $S_1$, $S_2$. For example, in an n-type enhancement MOSFET, the voltage to be applied between the gate terminal G and the source terminal S is a positive voltage and the voltage to be applied between the drain terminal D and the source terminal S is a positive voltage in order to cause the MOSFET to be in the on-state. The conducting channel along the drift control region dielectric 35 is an accumulation channel when the drift region 11 has the same doping type as the source and drain regions 13, 15, and the conducting channel is an inversion channel, when the drift region 11 is doped complementarily to these source and drain regions 13, 15.

Figure 11:
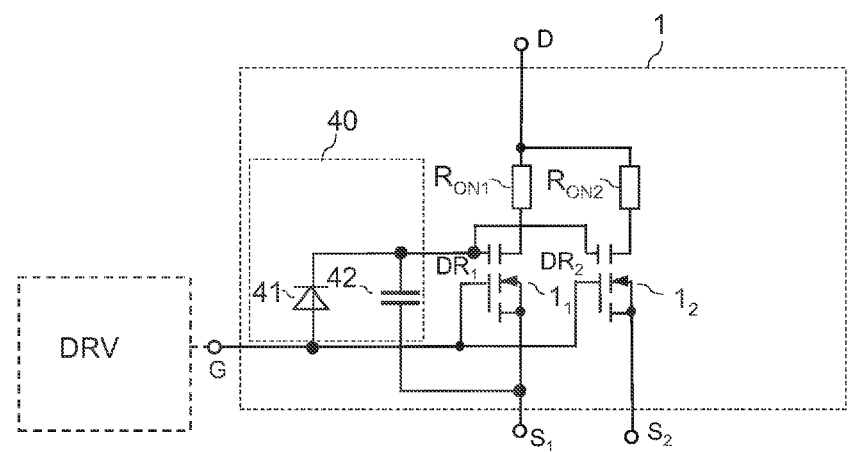
FIG. 11 illustrates a circuit diagram of the arrangement of FIG. 10 and a biasing circuit according to a first embodiment.
Figure 12:
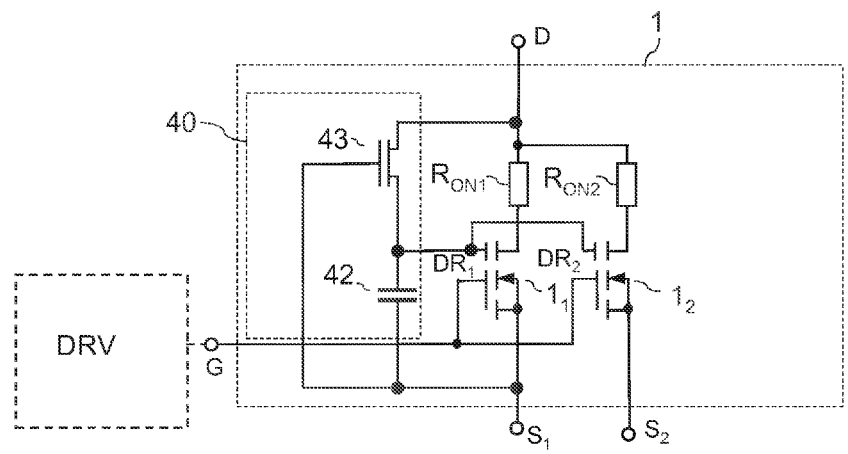
FIG. 12 illustrates a circuit diagram of the arrangement of FIG. 10 and a biasing circuit according to a second embodiment.

The semiconductor device arrangement further includes a biasing source 40 coupled to the drift control region 31. The biasing source 40 is configured to bias the drift control region 31 such that a conducting channel is generated in the drift region 11 along the drift control region dielectric 35 when the MOSFET is in the on-state. In an arrangement with an n-type MOSFET, the biasing source 40 is configured to charge the drift control region 31 such that the drift control region 31 assumes an electrical potential higher than the electrical potential of the drift region 11, when the MOSFET is in an on-state. In this case, an electron channel (as an accumulation or inversion channel, dependent on the doping type of the drift region 11) is generated in the drift region 11 along the drift control region dielectric 35. In an arrangement with a p-type MOSFET, the biasing source 40 is configured to charge the drift control region 31 such that the drift control region 31 assumes an electrical potential lower than the electrical potential of the drift region 11. The biasing source 40 can be implemented in many different ways. Two possible examples are illustrated in FIGS. 11 and 12. In FIGS. 11 and 12, the load transistor $1_1$ and the sense transistor $1_2$ are represented by circuit symbols. These circuit symbols are based on circuit symbols of conventional MOSFETs (specifically n-type MOSFETs in the present example) that include a second control terminal $DR_1$ and $DR_2$, respectively. These second control terminals $DR_1$, $DR_2$ are coupled to the drift control regions 31 of the individual devices and correspond to the electrodes 34 of FIG. 10.

In the embodiment illustrated in FIG. 10 and in the embodiments illustrated in FIGS. 11 and 12, one drive circuit 40 is provided for both, the load transistor $1_1$ and the sense transistor $1_2$. However, this is only an example. It is also possible to provide an individual drive circuit for each of the load transistor $1_1$ and the sense transistor $1_2$.

Referring to FIG. 11, the biasing source 40 can be connected to the gate terminal G and can include rectifier element 41, such as a diode, connected between the gate terminal G and the drift control region 31 (the second control terminals $DR_1$, $DR_2$ in FIG. 11). The polarity of the diode illustrated in FIG. 11 applies to an n-type MOSFET in which the gate terminal has an electrical potential higher than the source and body regions 13, 12 (see FIG. 10) when the MOSFET is in the on-state. In this embodiment, the drift control region 31 is charged through the gate drive circuit DRV (illustrated in dashed lines in FIG. 11) each time, the electrical potential at the gate terminal is higher (in an n-type MOSFET) or lower (in a p-type MOSFET) than the electrical potential of the drift control region 31.

Referring to FIG. 11, the biasing circuit 40 may further include a capacitive element 42, such as a capacitor, coupled between the drift control region 31 (the second control terminals $DR_1$, $DR_2$) and a terminal for a reference potential such as, for example, the first source terminal $S_1$ (as illustrated) or the second source terminal $S_2$. The capacitive element 42 serves to store charge carriers from the drift control region 31 when the MOSFET is in the off-state. These charge carriers are needed in the drift control region 31 for controlling (generating) the conducting channel in the drift region 11 along the drift control region dielectric 35 when the MOSFET is in the on-state. This is explained in further detail below. Storing charges in the capacitor 42 during off-periods of the MOSFET and providing these charges from the capacitor 42 when the MOSFET is switched on helps to reduce switching losses. The reduction of switching losses is, in particular, an issue when the MOSFET is operated at high switching frequencies.

According to a further embodiment (not illustrated), the drift control region 31 is simply connected to the gate electrode G (via the electrode 34 and the optional semiconductor region 33). In this embodiment, the gate drive circuit DRV connected to the gate terminal and configured to switch the MOSFET on and off by applying a suitable drive potential to the gate electrode G also acts as a biasing source that biases the drift control region 31 each time the MOSFET is switched on.

In the embodiment illustrated in FIG. 12, the biasing circuit 40 includes a depletion transistor 43, such as a depletion MOSFET. The depletion transistor 43 includes a load path (drain-source path) connected between the drain terminal D and the drift control region 31 (the second control terminals $DR_1$, $DR_2$) and a control terminal (gate terminal). The control terminal is connected to a terminal for a reference potential, such as, e.g., one of the first and second source terminal $S_1$, $S_2$. In this biasing circuit 40, the depletion transistor 43 charges the drift control region 31 through the drain terminal D until a voltage between the drift control region 31 and the reference terminal (the first source terminal $S_1$ in the embodiment of FIG. 12), corresponds to a pinch-off voltage of the depletion transistor 43.

Referring to FIG. 10, each transistor cell $10_1$, $10_2$ may further include a rectifier element 44, such as a diode, connected between the drain electrode 16 and a drain-sided end of the drift control region 31. The drift control region 31 extends along the drift region in a current flow direction of the MOSFET. The "drain-sided end" of the drift control region 31 is the end that is located towards the drain region 15 (or drain electrode 16) of the individual MOSFET $1_1$, $1_2$. Consequently, a "source-sided end" of the drift region 31 is the end that is located towards the source region 13 (or source electrode 14). Optionally, the rectifier element 44 is connected to a connection region 32 which has the same doping type as the source and drain regions 13, 15, so that the connection region 32 is n-doped in an n-type MOSFET and p-doped in a p-type MOSFET. The connection region 32 has a higher doping concentration than the drift control region 31. The doping concentration of the connection region 32 is, for example, in the range of between 10E15 cm-3 and 10E21 cm-3. The rectifier element 44 in FIG. 10 is shown only schematically. The rectifier element 44 may also be realized close to the first surface 101 of the semiconductor body 100 with electric conductive connections to the drift control region 31 or the connection region 32 on the one side and the drain electrode D on the other side. A dielectric insulation may be provided between the drift control region 31 and/or the connection region 32 and the drain contact 16 (not illustrated).

The MOSFET may further include a semiconductor region 33 doped complementarily to the source and drain regions 13, 15 of the MOSFET and adjoining the drift control region 31 at a source-sided end of the drift control region 31. In an n-type MOSFET the semiconductor zone 33 is p-doped, and in a p-type MOSFET the semiconductor zone 33 is n-doped. The biasing source 40 is connected to the drift control region 31 via this optional semiconductor region 33. The biasing source 40 can be connected to a contact electrode 34, with the contact electrode being connected to the drift control region 31 or the region 33, respectively. For electrically connecting the drift control region 31 or the semiconductor region 33 to the contact electrode 34, the drift control region 31 or the semiconductor region 33, respectively, may include a more highly doped contact region (not illustrated) of the same the doping type as the drift control region 31 or the semiconductor region 33, respectively. This contact region is contacted by the contact electrode 34.

The doping type of the drift control region 31 may correspond to the doping type of the drift region 11, or may be complementary to the doping type of the drift region. According to a further one embodiment, the drift control region 31 and/or the drift region 11 are intrinsic.

The basic operating principle of the transistor arrangement of FIG. 10 is now explained. For explanation purposes it is assumed that the MOSFET is an n-type enhancement MOSFET with an n-doped drift zone 11, and that the drift control region 31 has the same doping type as the drift region 11. In this case, the biasing source 40 is configured to bias the drift control region 31 to have a positive potential relative to the electrical potential of the source terminal S (source potential), when the MOSFET is in the on-state. The MOSFET is in the on-state, when the drive potential applied to the gate terminal G generates a conducting channel in the body region 12 between the source region 13 and the drift region 11, and when a positive voltage is applied between the drain and the source terminals D, S. In the on-state, the drift control region 31, which has a higher electrical potential than the drift region 11, generates an accumulation channel in the drift region 11 along the drift control region dielectric 35. This accumulation channel significantly reduces the on-resistance of the MOSFET as compared to a MOSFET without a drift control region. When the drift region 11 is doped complementarily to the source and drain regions 13, 15, the drift control region 31 generates an inversion channel in the drift region 11 along the drift control region dielectric 35.

The MOSFET is in the off-state, when the channel along the gate dielectric 18 in the body region 12 is interrupted. In this case, a depletion region expands in the drift region 11 beginning at a pn-junction between the body region 12 and the drift region 11. The depletion region expanding in the drift region 11 causes a depletion region also to expand in the drift control region 31, which, like the drift region 11, may include a monocrystalline semiconductor material. By virtue of a depletion region expanding in the drift region 11 and a depletion region expanding in the drift control region 31, a voltage across the drift control region dielectric 35 is limited.

In the off-state of the MOSFET, the capacitive storage element 42 serves to store electrical charges that are required in the drift control region 31 when the MOSFET is in its on-state. These charges are positive charges in an n-type MOSFET and can be provided by the semiconductor zone 33.

The rectifier element 44 allows charge carriers that are thermally generated in the drift control region 31 to flow to the drain region 15, in order to prevent an electrical potential of the drift control region 31 to increase in an uncontrolled manner. The rectifier element 44 therefore operates as a voltage limiting elements that limits a voltage difference between the electrical potential of the drift control region 31 and the drain electrode 15. This rectifier element 44 is connected up such that in the on-state of the MOSFET the drift control region 31 may assume a higher electrical potential than the potential at the drain terminal D.

In the embodiment illustrated in FIG. 10 the gate electrode 17 is a trench electrode arranged in a trench of the semiconductor body 100, with the trench extending from the first surface 101 in a vertical direction of the semiconductor body. However, this is only an example. The gate electrode 17 could also be implemented as a planar electrode (not shown) above the first surface 101 of the semiconductor body 100.

Figure 13:
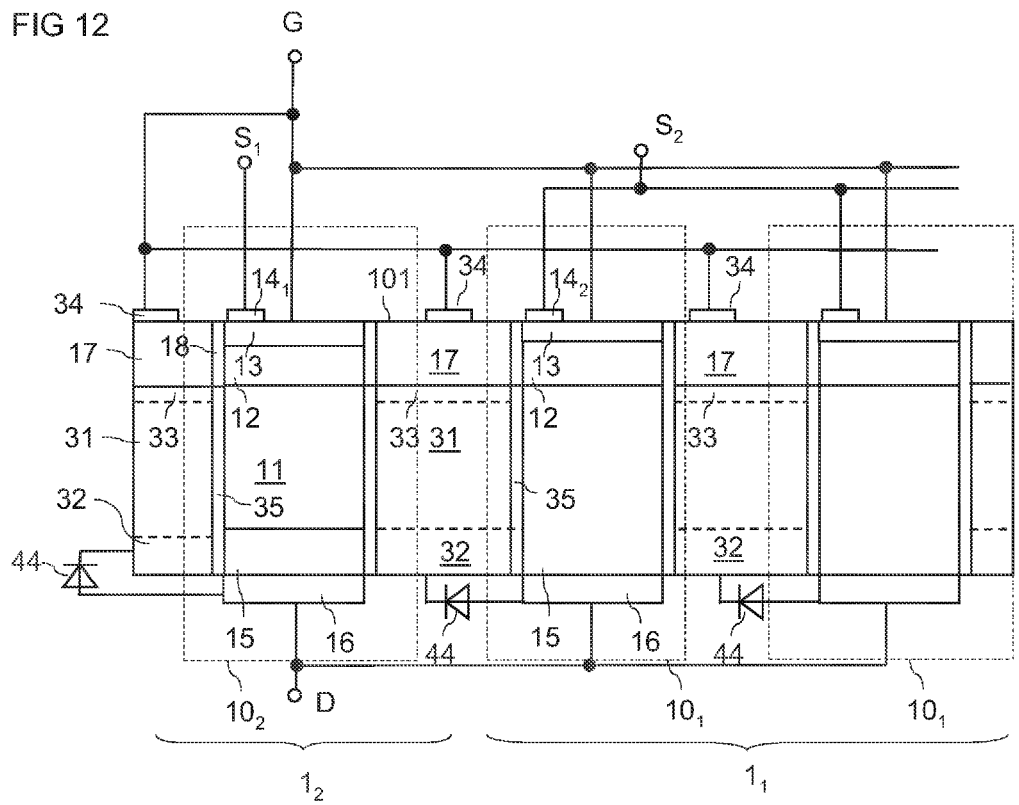
FIG. 13 illustrates a modification of the embodiment of FIG. 10.

FIG. 13 illustrates a vertical cross sectional view of a MOSFET according to a further embodiment. In this embodiment, the drift control region 31 or the optional semiconductor region 33 adjoins the gate electrode 17. In this embodiment, the gate electrode 17 includes a monocrystalline semiconductor material. According to one embodiment, the doping type and the doping concentration of the gate electrode corresponds to the doping type and the doping concentration of the drift control region 31. In this embodiment, the gate electrode 17 and the drift control region 31 are formed by a continuous monocrystalline semiconductor region of the same doping type and doping concentration. In this case, the gate electrode 17 is the semiconductor region adjacent the body region 12 and the drift control region 31 is the semiconductor region adjacent the drift region 11.

According to a further embodiment, the gate electrode 17 has the same doping type as the body region 12, which can be complementary to the doping type of the drift control region 31. The doping concentration of the gate electrode 17 may correspond to the doping concentration of the body region 12. In other words, the doping concentration of the gate electrode 17 may correspond to the doping concentration of the semiconductor region 33 explained before. This semiconductor region 33 can be omitted in this case.

The gate electrode 17 serves to control a conducting channel in the body region 12 and is dielectrically insulated from the body region 12 by the gate dielectric 18. The operating principle of the semiconductor device of FIG. 13 corresponds to the operating principle of the semiconductor device of FIG. 10 with the difference that in the semiconductor device of FIG. 13 the drift control region 31 is charged through the gate electrode 17 when the device is switched on and is discharged through the gate electrode. The required electrical charge is provided by the gate drive circuit. The drift control region dielectric 35 and the gate dielectric 18 that adjoin one another can be formed by one dielectric layer, which is a vertical dielectric layer in the embodiment of FIG. 13.

Figure 14:
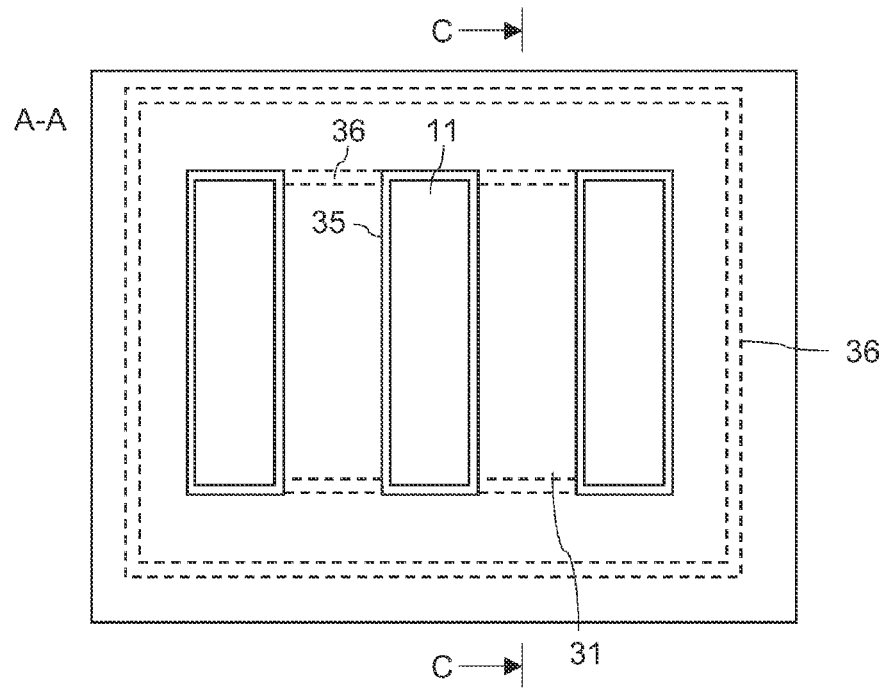
FIG. 14 illustrates a first embodiment for implementing load transistor cells and sense transistor cells of the arrangements of FIGS. 10 and 13 in a common semiconductor body.
Figure 15:
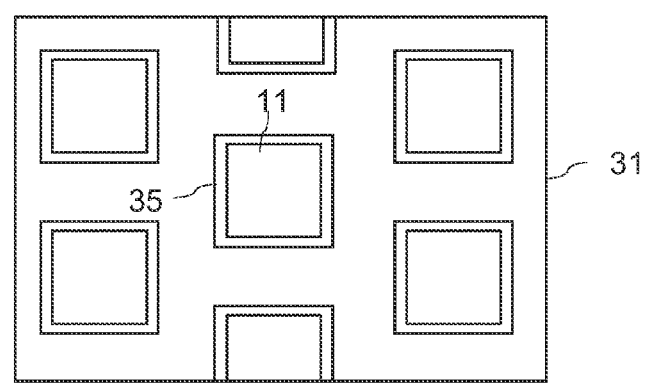
FIG. 15 illustrates a second embodiment for implementing load transistor cells and sense transistor cells of the arrangements of FIGS. 10 and 13 in a common semiconductor body.

In the horizontal plane, which is a plane parallel to the first surface 101 of the semiconductor body 100, the individual transistor cells can be implemented in many different ways. Two possible implementations are illustrated in FIGS. 14 and 15. FIGS. 14 and 15 show horizontal cross sectional views of the semiconductor body 100 in a section plane cutting through the drift region 11, the drift control region dielectric 35 and the drift control region 31 of the MOSFETs according to FIGS. 10 and 13.

Referring to FIG. 14, the drift regions 11 of the individual transistor cells may have an elongated (longitudinal, stripe) shape in the horizontal plane. One drift control region 31 may surround the individual drift regions 11. According to a further embodiment (illustrated in dashed lines in FIG. 7) there is a plurality of drift control regions 31 having a longitudinal shape, with each drift control region 31 being terminated by further dielectric layers 36 at the longitudinal ends.

Referring to FIG. 15, the drift regions 11 of the individual transistor cells may have a rectangular shape and are arranged in a hexagonal grid. However, the drift regions 11 could also be implemented with other shapes, such as elliptical, hexagonal, octagonal, or other polygonal shapes, or in other grids like rectangular or other grids, as well.

Figure 16:
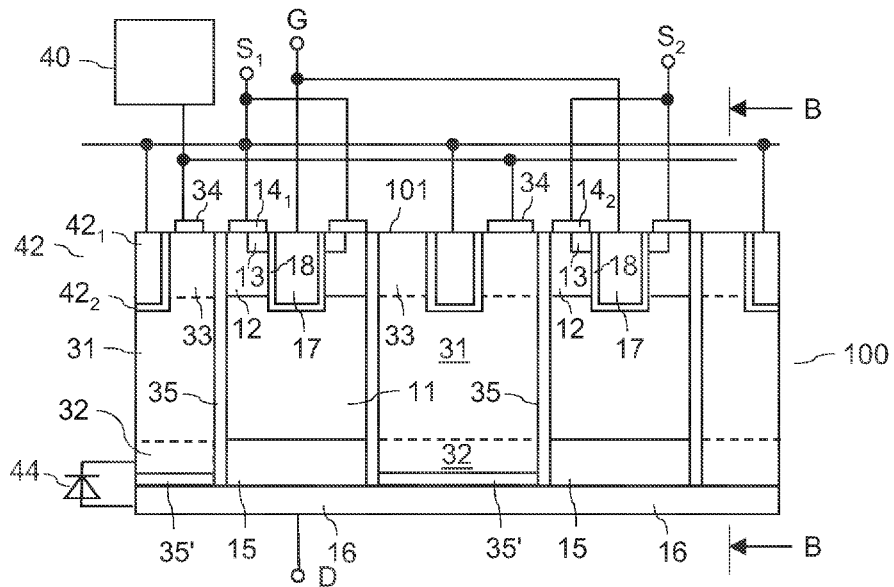
FIG. 16 illustrates a modification of the arrangement of FIG. 10.

Referring to FIG. 16 which illustrates a transistor arrangement that is based on the transistor arrangement of FIG. 10, the capacitive element 42 of the drive circuit 40 can be integrated in the semiconductor body 100 in the drift control region 31 and/or in the semiconductor region 33. In the embodiment illustrated in FIG. 16, a trench capacitor is integrated in each of the drift control regions 31 and includes a capacitor electrode $42_1$ dielectrically insulated from the drift control region 31 and the semiconductor region 33 by a capacitor dielectric. The capacitor electrode $42_1$ is connected to the terminal for the reference potential, such as one of the first and second source terminals $S_1$, $S_2$. The capacitor electrode $42_1$ forms a first capacitor electrode of the capacitor, while a second capacitor electrode is formed by the drift control region 31 and the semiconductor region 33. The capacitor 42 is still connected between the contact electrode $42_1$ and the terminal for the reference potential ($S_1$ in FIG. 16).

Further referring to FIG. 16, a further dielectric layer 35' can be arranged between a drain sided end of the drift control region 31 and the drain electrode 16. In this case, the drain electrode 16 can be a continuous electrode.

Figure 17:
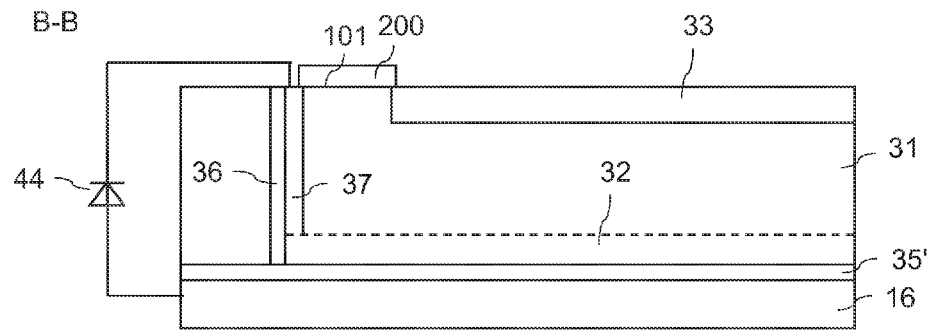
FIG. 17 illustrates a first embodiment for implementing a coupling between a drain terminal and a drift control region in the embodiments of FIGS. 10 and 16.

Referring to FIG. 17, in a MOSFET with longitudinal drift regions 11 and with a further dielectric layer 35' between the drain sided end of the drift control region 31 and the drain electrode 16, the rectifier element 44 can be connected to the drift control region 31 via the first surface 101. FIG. 17 illustrates a vertical cross sectional view of one drift control region 31 in a vertical section plane B-B illustrated in FIG. 16. In this embodiment, the drain electrode 16 is also arranged below the drift control region 31 but is dielectrically insulated from the drift control region by the further dielectric layer 35'. Thus, the drift control region 31 is arranged in a "dielectric well" that includes the drift control region dielectric 35 (out of view in FIG. 17), the dielectric layer 36 at the longitudinal ends (where in FIG. 17 only one longitudinal end is illustrated) and the further dielectric layer 35' at the bottom of the drift control region dielectric. The rectifier element 44 is connected between the drain electrode 16 and a further connection zone 37. The further connection zone 37 has the same doping type as the connection zone 32 and extends from the first surface 101 along the dielectric layer 36 at the longitudinal end to the connection zone 32, so as to connect the rectifier element 44 to the connection zone 32 at the drain-sided end of the MOSFET. The optional semiconductor region 33 is distant to the vertical connection region 37.

Figure 18:
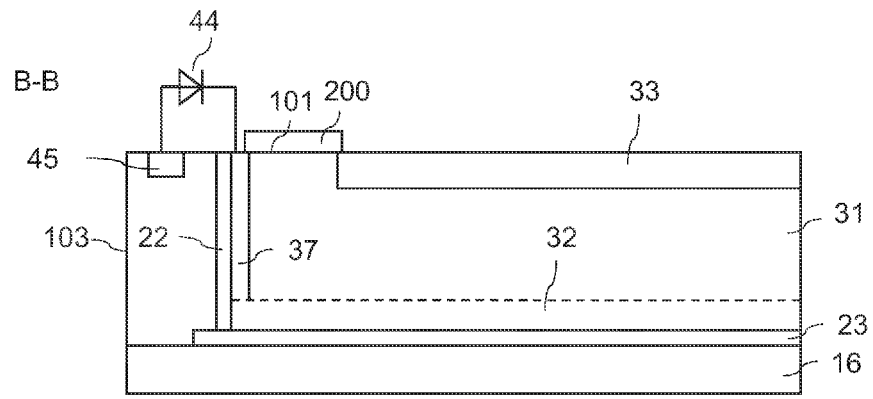
FIG. 18 illustrates a second embodiment for implementing a coupling between a drain terminal and a drift control region in the embodiments of FIGS. 10 and 16.

According to a further embodiment illustrated in FIG. 18, the rectifier element 44 is connected between a contact region 45 at the first surface 101 and the vertical connection region 37. The contact region 45 is located in an edge region of the semiconductor body 100. The edge region of the semiconductor body 100 is a region adjoining the cell field with the individual transistor cells and optionally adjoining a vertical edge 103 of the semiconductor body 100. The vertical edge 103 terminates the semiconductor body 100 in a horizontal direction. In this embodiment, the further dielectric layer 35' does not separate the edge region from the drain electrode 16, so that the drain electrode 16 is in contact with the edge region in which the contact region 45 is located. Optionally, a further vertical connection region may be present between one of the terminals of the rectifier element 44 or the contact region 45, respectively, and the drain electrode 16 (not illustrated).

Referring to FIGS. 17 and 18 the rectifying element is implemented outside an edge termination system 200 of the semiconductor body 100, wherein the edge termination system is a region adjoining the cell field with the individual transistor cells ($10_1$, $10_2$ in the embodiments explained before) and ensures a lateral blocking capability of the device in the off-state. The edge termination system is only schematically illustrated in FIGS. 17 and 18 and may include conventional edge termination structures, such as field plates and/or field rings.

Figure 19:
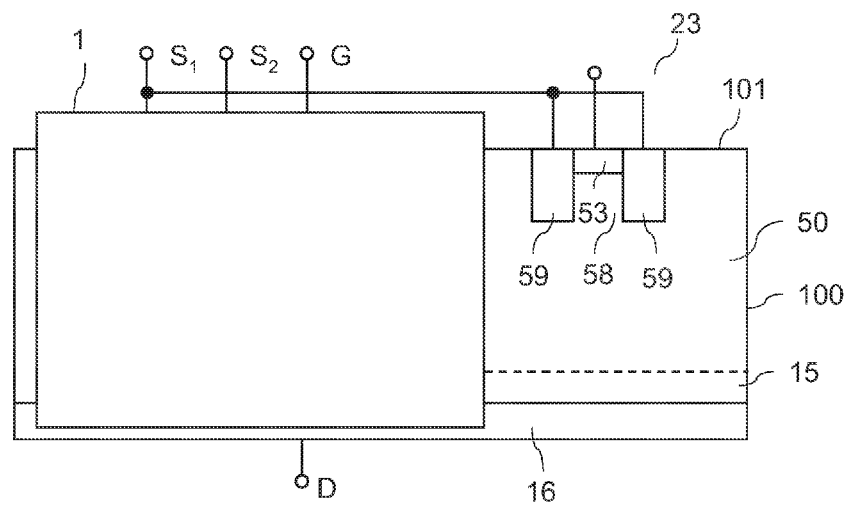
FIG. 19 illustrates a vertical cross sectional view of a semiconductor body in which a voltage clamping element according to a first embodiment is implemented.
Figure 20:
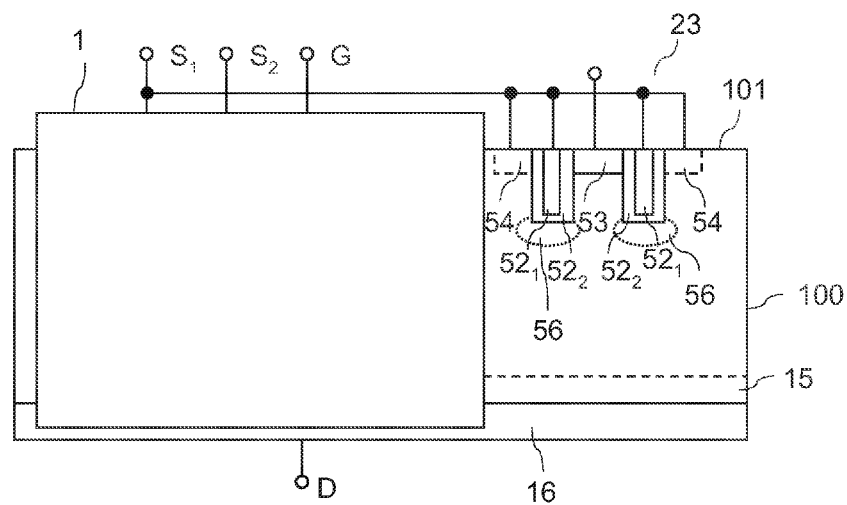
FIG. 20 illustrates a vertical cross sectional view of a semiconductor body in which a voltage clamping element according to a second embodiment is implemented.
Figure 21:
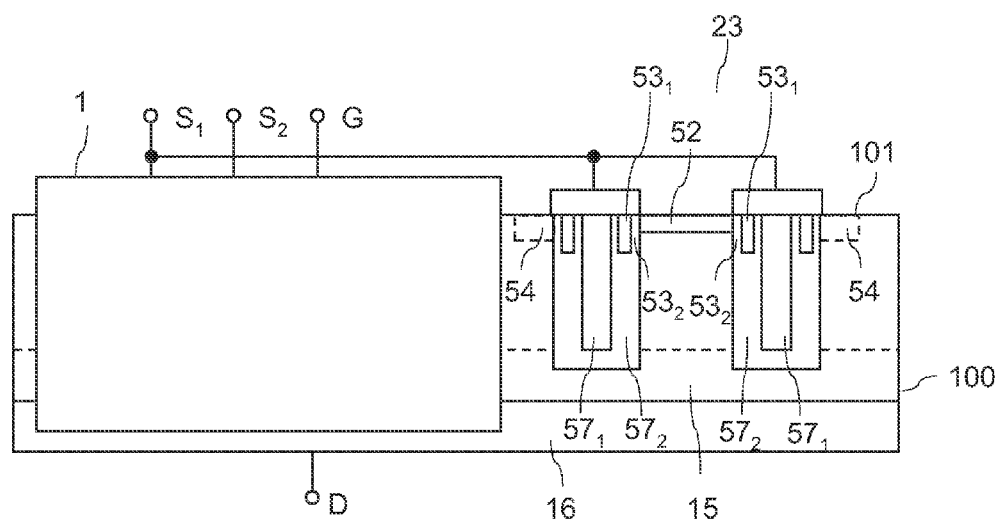
FIG. 21 illustrates a vertical cross sectional view of a semiconductor body in which a voltage clamping element according to a third embodiment is implemented.

As explained with reference to FIG. 5, a voltage clamping element can be connected between the common first load terminal D and the input terminal of the control and evaluation circuit 22. Different embodiments for implementing the clamping element 23 are explained with reference to FIGS. 19 to 21 below. In each of these embodiments, the clamping element 23 is implemented in a region adjoining the cell field with the individual transistor cells ($10_1$, $10_2$ in the embodiments explained before). However, the clamping element could also be implemented in a region surrounded by the cell field (this alternative is not shown in FIGS. 19 to 21). In FIGS. 19 to 21, the transistor arrangement 1 is only schematically illustrated and can be implemented in any of the ways explained before. Further, the clamping element is arranged in the region of the first surface 101 of the semiconductor body 100 distant to the drain electrode 16.

Referring to FIG. 19, the clamping element can be implemented as a JFET with a drift region 58 of a first doping type, a contact region 53 of the first doping type but more highly doped than the drift region 58, and with a gate region 59 of a second doping type complementary to the first doping type adjoining the drift region 58 and the contact region 53. The gate region adjoins the drift region 58 and the contact region 53 at least on two opposite sides in the horizontal plane and may surround these regions 58, 53 in the horizontal plane. The gate region 59 is connected to the terminal for the reference potential, such as the first source terminal $S_1$. The drift region 58 is electrically coupled to the drain electrode 16 via a semiconductor region 50 of the first doping type. The doping concentration of the semiconductor region 50 may correspond to the doping concentration of the JFET drift region and may correspond to the doping concentration of the drift regions in the transistor cells (not shown in FIG. 19). The semiconductor region 50 can be connected to the drain electrode 16 via the drain region 15. Referring to FIG. 19, the contact region 53 is connected to a connection terminal 231 that serves to connect the JFET to the input terminal of the control and evaluation circuit 22.

The operating principle of the JFET of FIG. 19 is explained in the following. For explanation purposes it is assumed that the JFET is an n-type JFET with an n-doped drift region 58 and a p-doped gate region 59. When a positive voltage is applied between the drain terminal D and the first source terminal $S_1$, a depletion region expands in the drift region 58 beginning at the pn junction between the gate region 59 and the drift region 58. The JFET is pinched off, when the depletion region completely extends through the drift region in the horizontal direction. The voltage (pinch-off voltage) at which the JFET pinches off can be adjusted dependent on the doping concentration of the drift region 58 and the width of the drift region 58, which is the dimension of the drift region in the horizontal direction. Until the JFET pinches off, the electrical potential at the terminal 231 corresponds to the drain potential (when the control and evaluation circuit 22 has a high input impedance).

In the embodiment illustrated in FIG. 20, the clamping element is implemented as a depletion MOSFET. This depletion MOSFET is different from the JFET of FIG. 19 in that the depletion MOSFET includes a gate electrode $52_1$ dielectrically insulated from the drift region 58 by a gate dielectric $52_2$ instead of a semiconductor gate region. Optionally, a floating semiconductor region 56 of the second doping type can be arranged below the gate electrode $52_1$ and the gate dielectric $52_2$. Further, an optional semiconductor region 54 of the second doping type can be arranged in the region of the first surface 101, adjoining the gate dielectric $52_2$ and separated from the contact region 53 by the gate electrode $52_1$ and the gate dielectric $52_2$.

In the embodiment illustrated in FIG. 21, the clamping element is implemented as a depletion MOSFET with a gate electrode structure corresponding to the gate electrode structure of the transistor cells illustrated in FIGS. 6 and 7. Like in the embodiment of FIG. 20, the gate region 59 is adjacent the gate electrode $53_1$ and dielectrically insulated from the gate electrode $53_1$ by a gate dielectric $53_2$. The clamping element 23 of FIG. 21 is, for example, implemented in a transistor arrangement with transistor cells as illustrated in FIGS. 6 and 7. In this case, the same process steps can be used to produce the gate electrode structure of the load transistor cells and the sense transistor cells on the one hand, and the gate electrode structure of the clamping element 23 on the other hand. Thus, the clamping element 23 also includes a field electrode $57_1$ and a field electrode dielectric $57_2$. However, these structural features would not be required in the clamping element.

In the circuit arrangement and the method explained before, the current through the load transistor $1_1$ is determined by: first measuring the on-resistance of the sense transistor $1_2$ or determining the on-resistance of the load transistor $1_1$ based on a measured on-resistance of the sense transistor $1_2$; by measuring a load voltage $V_{DS1}$ across the load transistor $1_1$; and by calculating the load current based on the determined on-resistance $R_{ON1}$ and the measured load voltage $V_{DS1}$. Referring to explanation above, the on-resistance of the load transistor $1_1$ may change dependent on external parameters such as a temperature in the load transistor, so that according to one embodiment, the external parameter is observed and the on-resistance of the load transistor $1_1$ (or of the sense transistor $1_2$) is re-calculated each time a significant change of the external parameter has been detected. According to a further embodiment, the on-resistance is re-calculated in regular or irregular time intervals.

When the load transistor $1_1$ and the sense transistor $1_2$ are implemented with transistor cells having a drift region 11 and a drift control region 31 as illustrated in FIG. 10, the on-resistances of the sense transistor $1_2$ and the load transistor $1_1$, respectively, can be dependent on an electrical potential applied to the drift control region 31. In this case, the calibration routine may include the calculation of several on-resistances $R_{ON1}$ of the load transistor, each for a different electrical potential of the drift control region 35. The calculated on-resistance and the value of the corresponding electrical potential of the drift control region 31 are stored in a memory the measurement circuit 2. When determining the load current through the load transistor $1_1$ not only the load voltage $V_{DS1}$, but also the electrical potential of the drift control region 31 is measured, the on-resistance corresponding to measured electrical potential of the drift control region is retrieved from the memory, and the load current is calculated using the measured load voltage and the retrieved on-resistance. Of course, the calibration routine for determining the on-resistances at different drift control region 31 potentials can be repeated regularly, irregularly or dependent on external parameters.

In the transistor cells $10_1$, $10_2$ illustrated in FIGS. 6 and 7, the field electrodes 51 are connected to one of the source terminals $S_1$, $S_2$. According to further embodiments (not illustrated), the field electrodes are connected to the gate terminals of the corresponding transistor cells $10_1$, $10_2$ or are connected to a drive circuit that in the on-state of the load transistor $1_1$ and the sense transistor $1_2$ applies an electrical potential to the field electrodes that is suitable to generate a conducting (accumulation) channel in the drift region 11 along the field electrode dielectric 52. In these embodiments, the on-resistances of the sense transistor $1_2$ and the load transistor $1_1$, respectively, can be dependent on an electrical potential applied to the field electrodes 51. In this case, the calibration routine may include the calculation of several on-resistances $R_{ON1}$ of the load transistor, each for a different electrical potential of the field electrodes 51. The calculated on-resistance and the value of the corresponding electrical potential of the field electrodes 51 are stored in a memory the measurement circuit 2. When determining the load current through the load transistor $1_1$ not only the load voltage $V_{DS1}$, but also the electrical potential of the field electrodes 51 is measured, the on-resistance corresponding to measured electrical potential of the drift control region is retrieved from the memory, and the load current is calculated using the measured load voltage and the retrieved on-resistance. Of course, the calibration routine for determining the on-resistances at different drift control region 31 potentials can be repeated regularly, irregularly or dependent on external parameters.

The terminals of the field electrode 51 and of the drift control region 31 can be considered as additional control terminals and the electrical potential at these terminals can be considered as an additional control potential, so that the on-resistance of the load transistor $1_1$ and of the sense transistor $1_2$ can be considered to be dependent on the additional control potential. There are also other types of transistor that have an additional control terminal, such as superjunction transistors. The principle explained before can be applied to these other types of transistors as well.

It should be noted that in each of the methods explained before, either the resistance of the sense transistor $1_2$ or the resistance of load transistor $1_1$ can be stored in the measurement circuit 2 and can be used to calculate the load current through the load transistor $1_1$ based on the measured load voltage $V_{DS1}$. In the first case, ratio between the active areas of the load transistor $1_1$ and the sense transistor $1_2$ needs to be considered in the calculation, while in the second case, the measured load voltage $V_{DS1}$ simply needs to be divided through this stored resistance of the load transistor $1_1$.

Spatially relative terms such as "under," "below," "lower," "over," "upper," and the like are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc., and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A circuit arrangement, comprising:
   a load transistor comprising a control terminal, a first load terminal and a second load terminal, wherein the load transistor is configured to be operated in an on-state or in an off-state;
   a sense transistor comprising a control terminal, a first load terminal and a second load terminal, wherein the first load terminal of the load transistor is coupled to the first load terminal of the sense transistor and wherein the sense transistor is configured to be operated in an on-state or in an off-state; and
   a measurement circuit comprising a current source configured to provide a calibration current, the measurement circuit configured to measure a first voltage between the first load terminal and the second load terminal of the sense transistor in the on-state of the sense transistor, to determine a resistance of the sense transistor based on the calibration current and the first voltage, to measure a second voltage between the first load terminal and the second load terminal of the load transistor in the on-state of the load transistor, and to determine a load current through the load transistor based on the resistance of the sense transistor and the second voltage.

2. The circuit arrangement of claim 1, wherein the control terminal of the load transistor is coupled to the control terminal of the sense transistor.

3. The circuit arrangement of claim 1, wherein the current source comprises a resistor coupled to a supply voltage terminal.

4. The circuit arrangement of claim 1,
   wherein the sense transistor comprises m transistor cells connected in parallel and the load transistor comprises n transistor cells connected in parallel, with m≥1 and with n≥1, and
   wherein the measurement circuit is configured to calculate the load current dependent on the ratio n/m.

5. The circuit arrangement of claim 1, wherein the sense transistor comprises m transistor cells connected in parallel and the load transistor comprises n transistor cells connected in parallel, with m≥1 and with n≥1.

6. The circuit arrangement of claim 5, wherein the measurement circuit is configured to calculate the load current through the load transistor to be proportional to $$V_{DS1} \cdot \frac{n}{m} \cdot R_{ON2} \text{ where}$$

$V_{DS2}$ is the first voltage, and
   $R_{ON2}$ is the resistance of the sense transistor.

7. The circuit arrangement of claim 1,
   wherein the measuring circuit comprises an input terminal coupled to the first load terminal of the load transistor and the first load terminal of the sense transistor; and
   wherein a voltage clamping element is coupled between the input terminal and the first load terminal of the load transistor and the first load terminal of the sense transistor.

8. The circuit arrangement of claim 7, wherein the voltage clamping element comprises a depletion transistor.

9. The circuit arrangement of claim 1, wherein the load transistor and the sense transistor are implemented in a common semiconductor body.

10. The circuit arrangement of claim 5, wherein each transistor cell comprises:
    a source region;
    a drift region;
    a body region separating the source region and the drift region; and
    a drain region spaced from the source region.

11. The circuit arrangement of claim 10, wherein the drain region is common to the transistor cells.

12. The circuit arrangement of claim 10, wherein each transistor cell further comprises:
    a field electrode adjacent the drift region and dielectrically insulated from the drift region by a field electrode dielectric.

13. The circuit arrangement of claim 12, wherein the field electrode dielectric extends to the drain region, into the drain region or is distant from the drain region less than two times a width of the drift region between two neighboring field electrode dielectrics.

14. The circuit arrangement of claim 12, wherein two transistors cells share one field electrode.

15. The circuit arrangement of claim 12, wherein each transistor cell further comprises:
- a drift control region of a monocrystalline semiconductor material adjacent the drift region; and
- a drift control region dielectric between the drift region and the drift control region.

16. A method for measuring current through a load transistor having a control terminal, a first load terminal and a second load terminal, the method comprising:
- operating a sense transistor in an on-state, thereby driving a calibration current through the sense transistor and measuring a first voltage between a first load terminal and a second load terminal of the sense transistor, wherein the first load terminal of the sense transistor is coupled to the first load terminal of the load transistor;
- determining a resistance of the sense transistor based on the calibration current and the first voltage;
- measuring a second voltage between the first load terminal and the second load terminal of the load transistor in an on-state of the load transistor; and
- determining a load current through the load transistor based on the resistance of the sense transistor and the second voltage.

17. The method of claim 16, wherein a control terminal of the sense transistor is coupled to the control terminal of the load transistor.

18. The method of claim 16,
wherein the sense transistor comprises m transistor cells connected in parallel and the load transistor comprises n transistor cells connected in parallel, with m≥1 and with n≥1, and
wherein the load current is calculated dependent on the ratio n/m.

19. The method of claim 16, wherein the sense transistor comprises m transistor cells connected in parallel and the load transistor comprises n transistor cells connected in parallel, with m≥1 and with n≥1.

20. The method of claim 16, wherein the load current through the load transistor is calculated to be proportional to $$V_{DS1} \cdot \frac{n}{m} \cdot R_{ON2}$$ where $V_{DS2}$ is the first voltage, and
$R_{ON2}$ is the resistance of the sense transistor.

21. The method of claim 16, wherein the load transistor and the sense transistor are implemented in a common semiconductor body.

22. The method of claim 19, wherein each transistor cell comprises:
- a source region;
- a drift region;
- a body region separating the source region and the drift region; and
- a drain region spaced from the source region.

23. The method of claim 22, wherein the drain region is common to the transistor cells.

24. The method of claim 23, wherein each transistor cell further comprises a field electrode adjacent the drift region and dielectrically insulated from the drift region by a field electrode dielectric.

25. The method of claim 22, wherein each transistor cell further comprises:
- a drift control region of a monocrystalline semiconductor material adjacent the drift region;
- a drift control region dielectric between the drift region and the drift control region.

26. The method of claim 16, wherein the resistance of the sense transistor is measured in regular time intervals.

27. The method of claim 16, wherein the resistance of the sense transistor is measured in irregular time intervals.

28. The method of claim 16, wherein the resistance of the sense transistor is measured dependent on an external parameter.

29. The method of claim 16, wherein the load transistor and the sense transistor are further configured to receive an additional drive potential at an addition control terminal, wherein the method further comprises:
- measuring resistances of the sense transistor at different additional drive potentials;
- measuring the second voltage and the additional drive potential; and
- determining the load current through the load transistor dependent on the second voltage and dependent on the resistance of the sense transistor corresponding to the measured additional drive potentials.

* * * * *